(12) United States Patent
Tian et al.

(10) Patent No.: US 11,974,493 B2
(45) Date of Patent: Apr. 30, 2024

(54) FLEXIBLE SUBSTRATE, DISPLAY PANEL AND DISPLAY APPARATUS

(71) Applicant: BOE TECHNOLOGY GROUP CO., LTD., Beijing (CN)

(72) Inventors: Hongwei Tian, Beijing (CN); Yanan Niu, Beijing (CN); Dong Li, Beijing (CN); Ming Liu, Beijing (CN); Zheng Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 539 days.

(21) Appl. No.: 17/281,420

(22) PCT Filed: Jun. 4, 2020

(86) PCT No.: PCT/CN2020/094304
§ 371 (c)(1),
(2) Date: Mar. 30, 2021

(87) PCT Pub. No.: WO2020/244567
PCT Pub. Date: Dec. 10, 2020

(65) Prior Publication Data
US 2021/0343954 A1    Nov. 4, 2021

(30) Foreign Application Priority Data
Jun. 6, 2019    (CN) .......................... 201910493077.X

(51) Int. Cl.
*H10K 77/10*      (2023.01)
*G09F 9/30*       (2006.01)
(Continued)

(52) U.S. Cl.
CPC ............ *H10K 77/111* (2023.02); *G09F 9/301* (2013.01); *H10K 59/131* (2023.02); *H10K 2102/311* (2023.02)

(58) Field of Classification Search
CPC ............... H10K 77/111; H10K 59/131; H10K 2102/311; H10K 59/1216; H10K 59/12;
(Continued)

(56) References Cited

U.S. PATENT DOCUMENTS

2016/0190216 A1    6/2016    Yang et al.
2016/0254328 A1    9/2016    Song
(Continued)

FOREIGN PATENT DOCUMENTS

CN    108511494    9/2018
CN    109616020    4/2019
(Continued)

OTHER PUBLICATIONS

Chinese First Office Action (w/ English translation) for corresponding CN Application No. 201910493077.X, 21 pages.
(Continued)

*Primary Examiner* — J. E. Schoenholtz
(74) *Attorney, Agent, or Firm* — Dority & Manning, P.A.

(57) ABSTRACT

A flexible substrate has at least one bendable region. The flexible substrate includes a flexible base, a first electrode layer disposed on the base, a first insulating layer disposed on a side of the first electrode layer away from the base, and a second electrode layer disposed on a side of the first insulating layer away from the base. The first electrode layer includes at least one first detection electrode, and the second electrode layer includes at least one second detection electrode. An orthogonal projection of a first detection electrode on the base overlaps at least partially with an orthogonal projection of a second detection electrode on the base. A region where orthogonal projections of the first detection electrode and the second detection electrode on the base are located overlaps with a bendable region.

19 Claims, 16 Drawing Sheets

(51) Int. Cl.
*H10K 59/131* (2023.01)
*H10K 102/00* (2023.01)

(58) Field of Classification Search
CPC ... H10K 59/1201; G09F 9/301; Y02E 10/549; Y02P 70/50
See application file for complete search history.

(56) References Cited

U.S. PATENT DOCUMENTS

| | | | |
|---|---|---|---|
| 2017/0060189 A1* | 3/2017 | Sohn | G06F 3/017 |
| 2018/0114491 A1 | 4/2018 | Tokuda | |
| 2018/0238716 A1 | 8/2018 | Madden et al. | |
| 2019/0064950 A1 | 2/2019 | Hsu | |
| 2019/0393278 A1* | 12/2019 | Wu | H10K 59/12 |
| 2021/0043701 A1 | 2/2021 | Li et al. | |

FOREIGN PATENT DOCUMENTS

| | | |
|---|---|---|
| CN | 109671355 | 4/2019 |
| CN | 110224009 | 9/2019 |
| KR | 20170025870 | 3/2017 |

OTHER PUBLICATIONS

Ji-Jun et al., "Comparison and research progress of flat panel display technology," (w/ English Translation), Chinese Optics, vol. 11, No. 5, Oct. 2018, 45 pages.

Chinese Notification to Grant Patent Right for Invention (w/ English translation) for corresponding CN Application No. 201910493077.X, 7 pages.

PCT International Search Report (w/ English translation) for corresponding PCT Application No. PCT/CN2020/094304, dated Sep. 10, 2020, 5 pages.

Veeraraghavan et al., "An 8X8 Pixel Array Pen-Input OLED Screen Based on Organic Magnetoresistance," IEEE Transactions on Electron Devices, vol. 54, No. 6, Jun. 2007, pp. 1571-1577.

\* cited by examiner

FLEXIBLE SUBSTRATE, DISPLAY PANEL AND DISPLAY APPARATUS

CROSS-REFERENCE TO RELATED APPLICATIONS

This application is a national phase entry under 35 USC 371 of International Patent Application No. PCT/CN2020/094304 filed on Jun. 4, 2020, which claims priority to Chinese Patent Application No. 201910493077.X, filed on Jun. 6, 2019, which are incorporated herein by reference in their entirety.

TECHNICAL FIELD

The present disclosure relates to the field of display technologies, and in particular, to a flexible substrate, a display panel and a display apparatus.

BACKGROUND

Organic electro luminescent display (also called organic light-emitting diode, OLED) panels are display devices capable of achieving flexible display, have gradually become mainstream products in the display field due to their excellent performance such as low power consumption, high color saturation, wide viewing angle, and small thickness, and may be widely applied to terminals such as smart phones, tablet computers, and televisions.

SUMMARY

In an aspect, a flexible substrate is provided. The flexible substrate has at least one bendable region. The flexible substrate includes a flexible base, a first electrode layer, a first insulating layer, and a second electrode layer. The first electrode layer is disposed on the base, and the first electrode layer includes at least one first detection electrode. The first insulating layer is disposed on a side of the first electrode layer away from the base. The second electrode layer is disposed on a side of the first insulating layer away from the base, and the second electrode layer includes at least one second detection electrode. An orthogonal projection of a first detection electrode on the base overlaps at least partially with an orthogonal projection of a second detection electrode on the base. A region where orthogonal projections of the first detection electrode and the second detection electrode on the base are located overlaps with a bendable region.

In some embodiments, the flexible substrate further has at least one non-bendable region. The first electrode layer further includes at least one first reference electrode. The at least one first reference electrode is insulated from the at least one first detection electrode. The second electrode layer further includes at least one second reference electrode. The at least one second reference electrode is insulated from the at least one second detection electrode. An orthogonal projection of a first reference electrode on the base overlaps at least partially with an orthogonal projection of a second reference electrode on the base. Orthogonal projections of the first reference electrode and the second reference electrode on the base are located in a non-bendable region.

In some embodiments, the first detection electrode and the second detection electrode are both strip-shaped electrodes. Extending directions of the first detection electrode and the second detection electrode the orthogonal projections of which on the base overlap are substantially the same. The first reference electrode and the second reference electrode are both strip-shaped electrodes. Extending directions of the first reference electrode and the second reference electrode the orthogonal projections of which on the base overlap are substantially the same.

In some embodiments, the bendable region is strip-shaped. An extending direction of the bendable region intersects with the extending direction of the first detection electrode. The extending direction of the bendable region is substantially the same as the extending directions of the first reference electrode and the second reference electrode the orthogonal projections of which on the base overlap.

In some embodiments, an included angle between the extending direction of the bendable region and the extending direction of the first detection electrode is in a range from 70° to 130°.

In some embodiments, the flexible substrate includes a plurality of first detection electrodes and a plurality of corresponding second detection electrodes, and one bendable region overlaps with regions where orthogonal projections of at least two first detection electrodes and at least two corresponding second detection electrodes on the base are located. Extending directions of the at least two first detection electrodes and the at least two corresponding second detection electrodes are substantially the same, the at least two first detection electrodes are disposed at intervals, and the at least two corresponding second detection electrodes are disposed at intervals. In the at least two first detection electrodes and the at least two corresponding second detection electrodes, lengths of a first detection electrode and a corresponding second detection electrode relatively away from a center of the flexible substrate in their extending direction are greater than lengths of a first detection electrode and a corresponding second detection electrode relatively proximate to the center of the flexible substrate in their extending direction.

The flexible substrate includes a plurality of first reference electrodes and a plurality of corresponding second reference electrodes, extending directions of the plurality of first reference electrodes and the plurality of corresponding second reference electrodes are substantially the same, the plurality of reference capacitors are disposed at intervals, and the plurality of corresponding second reference electrodes are disposed at intervals. In the plurality of first reference electrodes and the plurality of corresponding second reference electrodes, lengths of a first reference electrode and a corresponding second reference electrode relatively away from the center of the flexible substrate in their extending direction are greater than lengths of a first reference electrode and a corresponding second reference electrode relatively proximate to the center of the flexible substrate in their extending direction.

In some embodiments, the flexible substrate has a plurality of bendable regions disposed at intervals, and extending directions of the plurality of bendable regions are substantially the same. The flexible substrate includes a plurality of first detection electrodes and a plurality of corresponding second detection electrodes, and each bendable region overlaps with a region where orthogonal projections of at least one first detection electrode and at least one corresponding second detection electrode on the base are located.

The flexible substrate includes a plurality of first reference electrodes and a plurality of corresponding second reference electrodes, a number of the plurality of first reference electrodes is the same as a number of the plurality of first detection electrodes. The plurality of first reference electrodes are located at two opposite sides of the plurality of bendable regions as a whole in a direction perpendicular to an extending direction of the bendable regions.

In some embodiments, the first detection electrode and the second detection electrode each have a plurality of through holes. The first reference electrode and the second reference electrode each have a plurality of through holes.

In some embodiments, an orthogonal projection of the first electrode layer on the base is located within an orthogonal projection of the first insulating layer on the base, and the first electrode layer is covered by the first insulating layer.

In some embodiments, a material of the first insulating layer is the same as a material of the base.

In some embodiments, the flexible substrate further includes a barrier layer and a buffer layer. The barrier layer is disposed on a side of the second electrode layer away from the base. The buffer layer is disposed on a side of the barrier layer away from the second electrode layer.

In another aspect, a display panel is provided. The display panel includes the flexible substrate according to any one of the above embodiments, a common signal interface, and a detection signal interface. The common signal interface and the detection signal interface are disposed on the flexible substrate. One of the first detection electrode and the second detection electrode in the flexible substrate is coupled to the detection signal interface, and another one is coupled to the common signal interface.

In some embodiments, the flexible substrate includes at least one first reference electrode and at least one second reference electrode, one of the first reference electrode and the second reference electrode is coupled to the detection signal interface, and another one is coupled to the common signal interface. Electrodes in a same electrode layer are coupled to a same interface.

In some embodiments, the display panel further includes at least one detection wire disposed on the flexible substrate. A detection wire in the at least one detection wire connects the detection signal interface to the first detection electrode or the second detection electrode.

The flexible substrate includes at least one first reference electrode and at least one second reference electrode, and the display panel further includes at least one reference wire disposed on the flexible substrate. A reference wire in the at least one reference wire connects the detection signal interface to the first reference electrode or the second reference electrode.

In some embodiments, the display panel further includes at least one thin film transistor disposed on the flexible substrate. The thin film transistor includes an active layer, a gate, a source, a drain, a portion of a gate insulating layer disposed between the active layer and the gate, and a portion of an interlayer dielectric layer disposed between the gate and both the source and the drain. The detection wire is disposed in a same layer and made of a same material as the source and the drain of the thin film transistor. The detection wire is coupled to the first detection electrode or the second detection electrode through a first via hole. The first via hole penetrates film layers between a film layer where the source and the drain are located and the first electrode layer or the second electrode layer.

The reference wire is disposed in a same layer and made of a same material as the source and the drain of the thin film transistor. The reference wire is coupled to the first reference electrode or the second reference electrode through a second via hole. The second via hole penetrates the film layers between the film layer where the source and the drain are located and the first electrode layer or the second electrode layer.

In some embodiments, the display panel further includes at least one signal amplification circuit. The at least one signal amplification circuit is disposed on the flexible substrate or is bonded to the flexible substrate. The detection wire is coupled to the detection signal interface through a signal amplification circuit. The reference wire is coupled to the detection signal interface through a signal amplification circuit or another signal amplification circuit.

In some embodiments, the display panel includes one signal amplification circuit, a plurality of detection wires and a plurality of reference wires. Each detection wire is coupled to the signal amplification circuit. The signal amplification circuit is configured to sequentially perform amplification processing on signals from the detection wires in a time-sharing manner. The signal amplification circuit is further coupled to each reference wire. The signal amplification circuit is further configured to sequentially perform amplification processing on signals from the reference wires in a time-sharing manner.

In some embodiments, the display panel includes a plurality of signal amplification circuits. Each detection wire is connected to one signal amplification circuit. Each reference wire is connected to another signal amplification circuit. A signal amplification circuit in the plurality of signal amplification circuits is configured to perform amplification processing on a signal from a detection wire or a reference wire to which the signal amplification circuit is coupled.

In yet another aspect, a display apparatus is provided. The display apparatus includes the display panel according to any one of the above embodiments and a signal processor. The signal processor is coupled to the detection signal interface in the display panel. The signal processor is configured to receive a detection signal transmitted by the detection signal interface, obtain an amount of change of a capacitance between at least one first detection electrode and at least one corresponding second detection electrode in the display panel according to the detection signal, and obtain a bending angle of the display panel according to the amount of change of the capacitance.

In some embodiments, the display apparatus further includes a command recognition component and a bending drive mechanism. The bending drive mechanism is coupled to the command recognition component. The command recognition component is configured to recognize a user command. The bending drive mechanism is configured to drive the display panel to bend according to the user command, and control the display panel to stop bending in a case where the bending angle of the display panel reaches a preset angle.

BRIEF DESCRIPTION OF THE DRAWINGS

In order to describe technical solutions in the present disclosure more clearly, accompanying drawings to be used in some embodiments of the present disclosure will be introduced below briefly. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, an actual process of a method and actual timings of signals to which the embodiments of the present disclosure relate.

DETAILED DESCRIPTION

Figure 1:
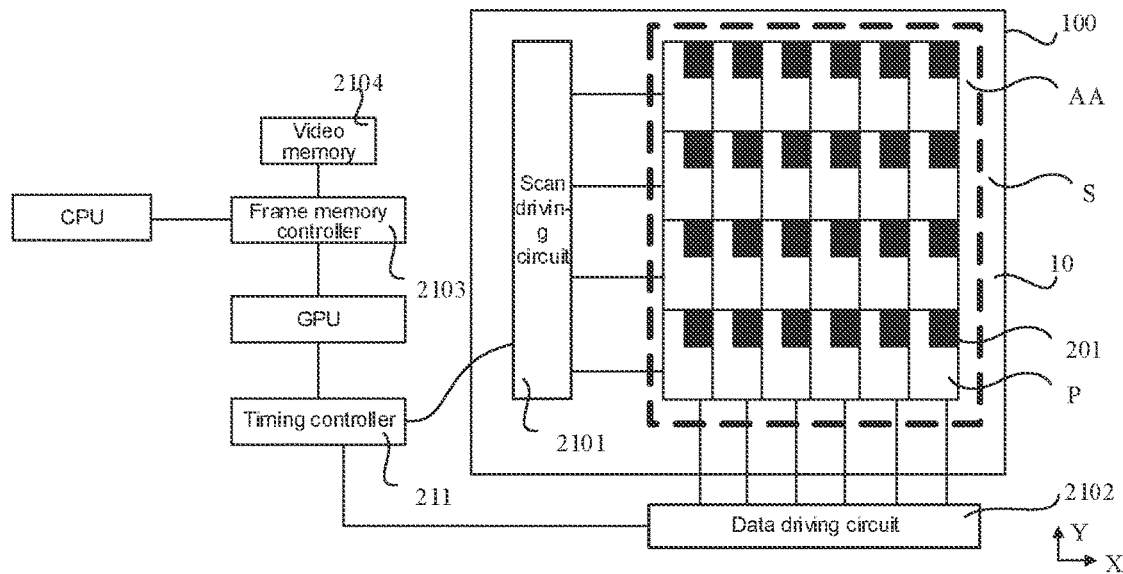
FIG. 1 is a diagram showing a structure of a display apparatus, in accordance with some embodiments.

Technical solutions in some embodiments of the present disclosure will be described below clearly and completely with reference to the accompanying drawings. Obviously, the described embodiments are merely some but not all embodiments of the present disclosure. All other embodiments obtained based on the embodiments of the present disclosure by a person of ordinary skill in the art shall be included in the protection scope of the present disclosure.

Unless the context requires otherwise, the term "comprise" and other forms thereof such as the third-person singular form "comprises" and the present participle form "comprising" throughout the description and the claims are construed as open and inclusive, i.e., "inclusive, but not limited to". In the description, the terms such as "one embodiment," "some embodiments," "exemplary embodiments," "example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, features defined as "first" and "second" may explicitly or implicitly include one or more of the features. In the description of the embodiments of the present disclosure, the term "a plurality of" means two or more unless otherwise specified.

In the description of some embodiments, the terms "coupled" and "connected" and their extensions may be used. For example, the term "connected" may be used in the description of some embodiments to indicate that two or more components are in direct physical contact or electric contact with each other. For another example, the term "coupled" may be used in the description of some embodiments to indicate that two or more components are in direct physical or electric contact. However, the term "coupled" or "communicatively coupled" may also mean that two or more components are not in direct contact with each other, but still cooperate or interact with each other. The embodiments disclosed herein are not necessarily limited to the contents herein.

The use of the phrase "applicable to" or "configured to" means an open and inclusive language, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

The term "substantially" or "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and regions are enlarged for clarity. Thus, variations in shapes relative to the accompanying drawings due to, for example, manufacturing techniques and/or tolerances may be envisaged. Therefore, the exemplary embodiments should not be construed to be limited to the shapes of regions shown herein, but to include deviations in the shapes due to, for example, manufacturing. For example, an etched region shown in a rectangular shape generally has a curved feature. Therefore, the regions shown in the accompanying drawings are schematic in nature and their shapes are not intended to show actual shapes of the regions in a device and are not intended to limit the scope of the exemplary embodiments.

Embodiments of the present disclosure provide a display apparatus 300. As shown in FIG. 1, the display apparatus 300 includes a display panel 100.

For example, the display panel 100 is an organic light-emitting diode (BLED) display panel.

As shown in FIG. 1, the display panel 100 has an active area (AA) and a frame area S disposed on at least one side of the active area AA.

As shown in FIG. 1, the display apparatus 300 further includes a scan driving circuit 2101, a data driving circuit 2102, a frame storage controller 2103, and a graphics processing unit (GPU), a timing controller 211, a video memory 2104, and a central processing unit (CPU).

The scan driving circuit 2101 may be disposed in the frame area S of the display panel 100.

The frame storage controller 2103 is coupled to the video memory 2104, and the CPU is coupled to the frame storage controller 2103. The GPU is coupled to the frame storage controller 2103, and is coupled to the timing controller 211. The timing controller 211 is coupled to the scan driving circuit 2101 and the data driving circuit 2102.

It can be understood that, the CPU writes a frame video debugging signal included in received image data into the video memory 2104 through the frame storage controller 2103. The GPU retrieves the frame video debugging signal written into the video memory 2104 through the frame storage controller 2103, and the CPU writes a next frame video debugging signal into the video memory 2104 through the frame storage controller 2103. The GPU performs processes such as decoding, scaling and rendering on the retrieved frame video debugging signal to obtain display data. The timing controller 211 performs further processes such as gray-scale modulation on the display data to generate synchronization signal(s), clock signal(s), processed data signal(s), synchronization signal(s) of clock signal(s), and transmits these signals to the scan driving circuit 2101 and the data driving circuit 2102 to control the display panel 100 to display an image.

In addition, the timing controller 211 may also process video signals in addition to generating timing control signals.

As shown in FIG. 1, the display panel 100 further includes a plurality of sub-pixels P disposed in the active area AA.

It will be noted that, FIG. 1 shows an example in which the plurality of sub-pixels P are arranged in an array, but embodiments of the present disclosure are not limited thereto, and the plurality of sub-pixels P may also be arranged in other manners. In FIG. 1, sub-pixels P arranged in a line in a horizontal direction X are referred to as sub-pixels in a same row, and sub-pixels P arranged in a line in a vertical direction Y are referred to as sub-pixels in a same column.

As shown in FIG. 1, each sub-pixel P is provided with a pixel circuit 201 therein.

Figure 2:
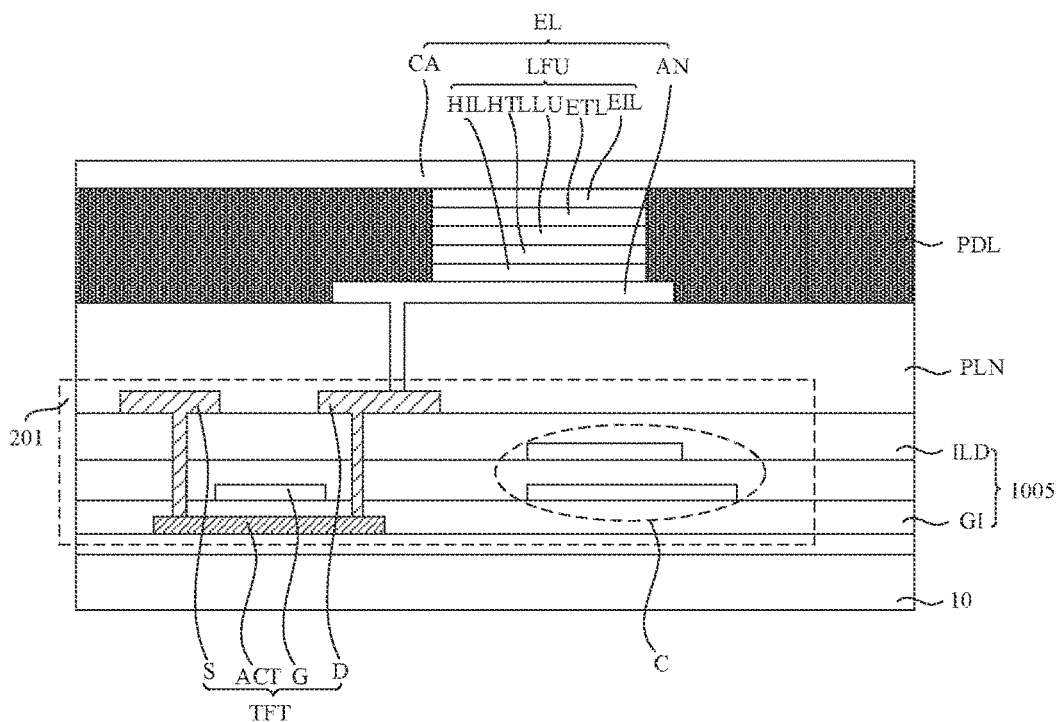
FIG. 2 is a diagram showing a structure of a sub-pixel, in accordance with some embodiments.

The pixel circuit 201 is generally composed of electronic devices such as thin film transistors (abbreviated as TFTs) and capacitor(s) (abbreviated as C(s)). For example, the pixel circuit 201 may be a pixel circuit 201 with a 2T1C structure composed of two thin film transistors (a switching transistor and a driving transistor) and one capacitor, or a pixel circuit 201 with a 3T1C structure composed of three thin film transistors (two switching transistors and one driving transistor) and one capacitor. Of course, the pixel circuit 201 may also be a pixel circuit 201 composed of more than two thin film transistors (a plurality of switching transistors and one driving transistor) and at least one capacitor. FIG. 2 shows only one TFT in the pixel circuit 201.

It will be noted that, there are multiple types of the TFT. The TFT may be an N-channel metal oxide semiconductor (NMOS) TFT or a P-channel metal oxide semiconductor (PMOS) TFT, and a difference between them lies only in turn-on conditions. The NMOS TFT is turned on at a high level and is turned off at a low level. The PMOS TFT is turned on at a low level and is turned off at a high level.

For example, as shown in FIG. 2, the TFT includes an active layer ACT, a gate G, a source S and a drain D. A gate insulating layer GI is provided between the active layer ACT and the gate G. A capacitor C in the pixel circuit 201 includes a first electrode disposed in a same layer as the gate G of the TFT, a second electrode located above the first electrode, and a portion of an insulating layer located between the first electrode and the second electrode. A material of the second electrode and a material of the first electrode are both the same as a material of the gate G. Therefore, in terms of process, the first electrode of the capacitor C is formed at a same time when the gate G of the TFT is formed, and the second electrode of the capacitor C is formed above the gate G before the source S and the drain D of the TFT are formed.

As shown in FIG. 2, each sub-pixel P further includes a light-emitting device EL coupled to the pixel circuit 201. For example, the light-emitting device EL may be coupled to one of the source S and the drain D of the TFT in the pixel circuit 201.

In addition, a planarization layer PLN is further provided on the TFT to ensure that a film surface of the light-emitting device EL is flat. A pixel defining layer PDL is further provided on the planarization layer PLN to separate two adjacent sub-pixels.

For example, the light-emitting device EL includes a cathode layer CA and an anode layer AN, and a light-emitting functional layer LFU located between the cathode layer CA and the anode layer AN. The light-emitting functional layer LFU may include, for example, a light-emitting layer LU, a hole transport layer HTL located between the light-emitting layer LU and the anode layer AN, and an electron transport layer ETL located between the light-emitting layer LU and the cathode layer CA. Of course, according to needs, in some embodiments, a hole injection layer HIL may be provided between the hole transport layer HTL and the anode layer AN, and an electron injection layer EIL may be provided between the electron transport layer ETL and the cathode layer CA.

It will be noted that, arrangements of the film layers in the light-emitting functional layer LFU may be determined according to positions of the anode layer AN and the cathode layer CA.

In this case, the anode layer AN injects holes into the hole injection layer HIL, and the holes are transported to the light-emitting layer LU through the hole transport layer HTL. The cathode layer CA injects electrons into the electron injection layer EIL, and the electrons are transported to the light-emitting layer LU through the electron transport layer ETL. The electrons and the holes recombine into excitons in the light-emitting layer LU, and energy of the excitons is transferred and released in a form of light, so that the light-emitting device EL emits light.

The scan driving circuit 2101 may be coupled to the gate G of the TFT in the pixel circuit 201 and the data driving circuit 2102 may be coupled to one of the source S and the drain D of the TFT in the pixel circuit 201, so as to drive the light-emitting device EL to emit light through scan signals and data signals, thereby displaying an image.

A capacitor substrate may be additionally disposed outside the display panel. In a bending process of the display panel, the capacitor substrate is used to monitor a change of capacitance of the light-emitting devices in the display panel in the bending process to obtain bending information of the display panel. However, this causes a thickness of the display panel to be large, and makes it difficult to achieve lightness and thinness.

Figure 3:
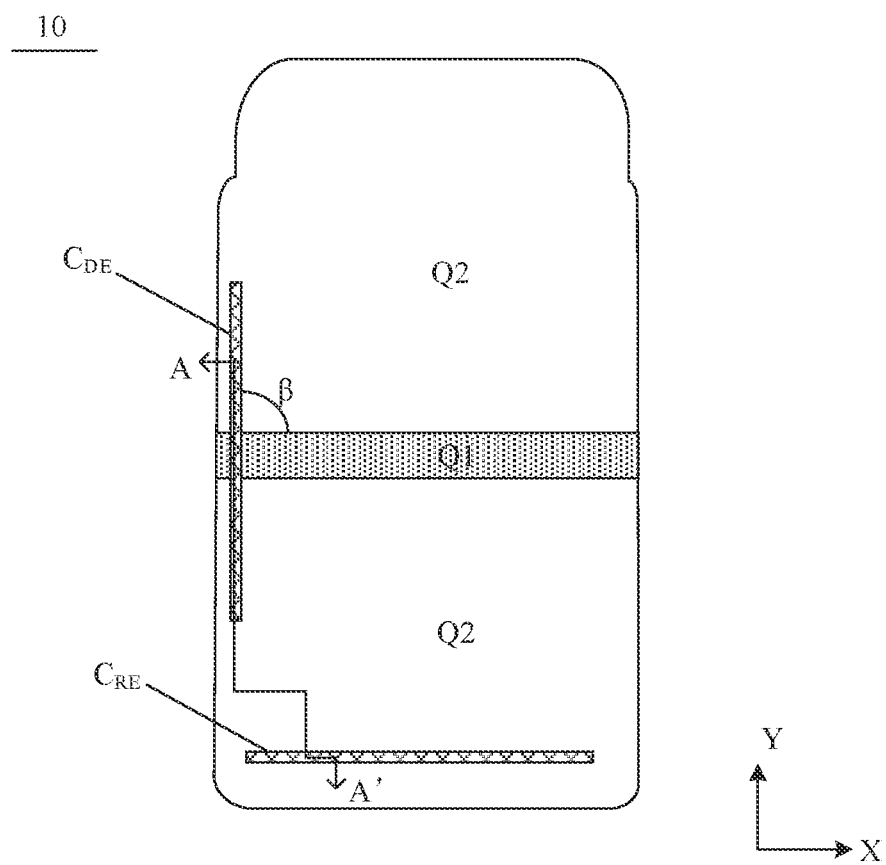
FIG. 3 is a diagram showing a structure of a flexible substrate, in accordance with some embodiments.
Figure 4:
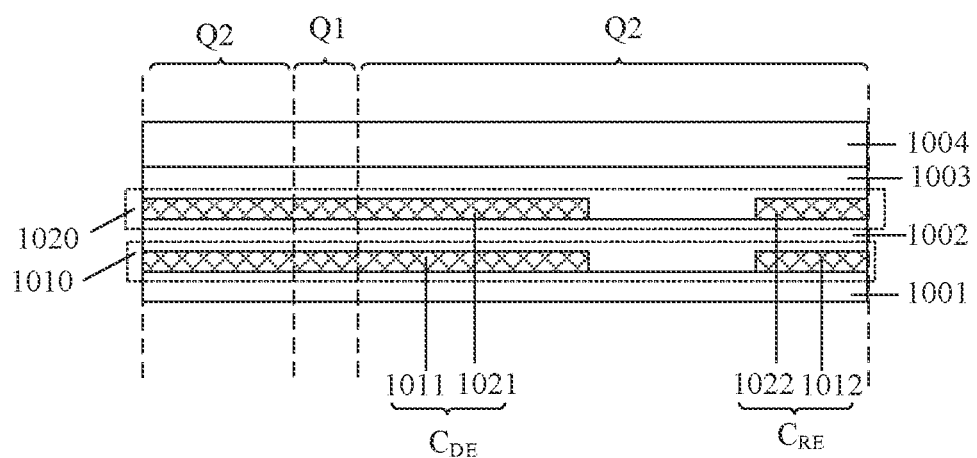
FIG. 4 is a sectional view of the flexible substrate taken along the A-A' direction in FIG. 3, in accordance with some embodiments.

Embodiments of the present disclosure provide a flexible substrate 10. As shown in FIGS. 3 and 4, the flexible substrate 10 has at least one bendable region Q1. The flexible substrate 10 includes a base 1001 a first electrode layer 1010 disposed on the base 1001, a first insulating layer 1002 disposed on a side of the first electrode layer 1010 away from the base 1001, and a second electrode layer 1020 disposed on a side of the first insulating layer 1002 away from the base 1001.

The base 1001 has flexibility. For example, a material of the base 1001 may be an organic polymer including materials such as polyimide (PI).

The first electrode layer 1010 includes at least one first detection electrode 1011. The second electrode layer 1020 includes at least one second detection electrode 1021.

An orthogonal projection of a first detection electrode 1011 on the base 1001 overlaps at least partially with an orthogonal projection of a second detection electrode 1021 on the base 1001. The first detection electrode 1011 the second detection electrode 1021 and a portion of the first insulating layer 1002 therebetween form a detection capacitor $C_{DE}$.

The number of the first detection electrode(s) 1011 is equal to the number of the second detection electrode(s) 1021.

It can be understood that, the orthogonal projections of the first detection electrode 1011 and the second detection electrode 1021 that constitute a same detection capacitor $C_{DE}$ on the base 1001 may overlap or coincide.

As shown in FIG. 3, an orthogonal projection of the detection capacitor $C_{DE}$ on the base 1001 overlaps with a bendable region Q1.

Each bendable region Q1 overlaps with an orthogonal projection of at least one detection capacitor $C_{DE}$ on the base 1001.

It can be understood that, the orthogonal projections of the first detection electrode 1011 and the second detection electrode 1021 that constitute the same detection capacitor $C_{DE}$ on the base 1001 overlap with a same bendable region Q1.

For example, a thickness of the base 1001 may be in a range from 0.1 μm to 10 μm, or in a range from 0.1 μm to 0.95 μm. The base 1001 may have a one-layer structure or a two-layer structure. Of course, it may also have a multiple-layer structure.

It will be noted that, the number of the layer(s) of the base 1001 may be set according to the flexibility of the base 1001. Thicknesses of the first electrode layer 1010, the first insulating layer 1002 and the second electrode layer 1020 may be designed according to actual conditions, and are not limited herein. Moreover, on a premise of ensuring conductive performance of the first electrode layer 1010 and the second electrode layer 1020, the thicknesses of the first electrode layer 1010 and the second electrode layer 1020 may be as small as possible.

For example, as shown in FIG. 3, the flexible substrate 10 has one bendable region Q1, and the bendable region Q1 overlaps with an orthogonal projection of one detection capacitor $C_{DE}$ on the base 1001. When the flexible substrate 10 is not bent, a capacitance detected through the detection capacitor $C_{DE}$ is $C_0$, and when the flexible substrate 10 is bent, a capacitance detected through the detection capacitor $C_{DE}$ is $C_t$.

Figure 18:
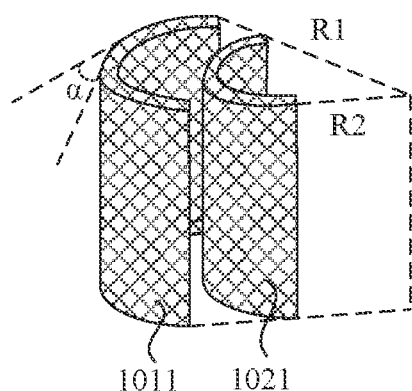
FIG. 18 is a diagram of a detection capacitor being in a bent state, in accordance with some embodiments.

In a case where the detection capacitor $C_{DE}$ is approximately regarded as a cylindrical capacitor, since a magnitude of a capacitance of the cylindrical capacitor is related to a radius of the cylindrical capacitor, the larger an angle at which the cylindrical capacitor is bent, the smaller the radius of the cylindrical capacitor. For example, as shown in FIG. 18, in the bending process, the larger the angle α at which the detection capacitor $C_{DE}$ is bent, the smaller a radius R1 of the first detection electrode 1011 and a radius R2 of the second detection electrode 1021. The angle α at which the detection capacitor $C_{DE}$ is bent is an included angle between a bent portion of the detection capacitor $C_{DE}$ and a plane where the detection capacitor $C_{DE}$ is located when not bent. Therefore, the capacitance of the detection capacitor $C_{DE}$ is related to a bending angle of the bendable region Q1. An amount of change of capacitance of the bendable region Q1 before and after the bending may be obtained according to $C_0$ to $C_t$, and the bending angle of the bendable region Q1 may be obtained according to the amount of change of capacitance of the bendable region Q1 before and after the bending.

Moreover, in a case where the flexible substrate 10 has a plurality of bendable regions Q1, it is possible to obtain a bending angle of each bendable region Q1 and bending positions of the flexible substrate 10 through an amount of change of capacitance of a detection capacitor $C_{DE}$ in each bendable region Q1 before and after the flexible substrate 10 is bent.

In this case, since in the bending process of the flexible substrate 10, the capacitance of the detection capacitor $C_{DE}$ whose orthogonal projection on the base 1001 overlaps with the bendable region Q1 is changed, bending information (e.g., the bending angle) of the bendable region Q1 with which the orthogonal projection of the detection capacitor $C_{DE}$ on the base 1001 overlaps may be obtained according to the amount of change of capacitance of the detection capacitor $C_{DE}$ detected through the first detection electrode 1011 and the second detection electrode 1021 of the detection capacitor $C_{DE}$, thereby detecting bending information of the at least one bendable region Q1 when the flexible substrate 10 is bent.

In addition, in a case where the flexible substrate 10 is applied to a display panel, compared with a case where a capacitor coupled to the flexible substrate is additionally disposed outside the flexible substrate, the detection capacitor $C_{DE}$ is disposed in the flexible substrate 10 in the embodiments of the present disclosure, thereby reducing a thickness of the display panel, and achieving lightness and thinness of the display panel.

For example, in the case where the flexible substrate 10 is applied to the display panel, the detection capacitor $C_{DE}$ is disposed at a position at an edge of the flexible substrate 10 (i.e., a position at an edge of the display panel), which avoids affecting normal display of the display panel.

Therefore, the flexible substrate 10 in the embodiments of the present disclosure has the at least one bendable region Q1. The first detection electrode 1011, the second detection electrode 1021, and a portion of the first insulating layer 1002 therebetween form a detection capacitor $C_{DE}$.

In this case, the bending information (e.g., the bending angle) of the bendable region Q1 with which the orthogonal projection of the detection capacitor $C_{DE}$ on the base 1001 overlaps may be obtained according to the amount of change of capacitance of the detection capacitor $C_{DE}$ detected through the first detection electrode 1011 and the second detection electrode 1021 of the detection capacitor C, thereby detecting the bending information of the at least one bendable region Q1 when the flexible substrate 10 is bent. Therefore, in the case where the flexible substrate 10 is applied to the display panel, the display panel can not only perform flexible display, but also detect the bending information, and diversification of functions of the display panel is achieved. Moreover, by providing the detection capacitor $C_{DE}$ in the flexible substrate 10, the thickness of the display panel may be reduced, and the display panel may be made light and thin.

In some embodiments, as shown in FIGS. 3 and 4, the flexible substrate 10 further has at least one non-bendable region Q2.

The first electrode layer 1010 further includes at least one first reference electrode 1012.

The at least one reference electrode 1012 is insulated from the at least one first detection electrode 1011.

The second electrode layer 1020 further includes at least one second reference electrode 1022.

The at least one second reference electrode 1022 is insulated from the at least one second detection electrode 1021.

An orthogonal projection of a first reference electrode 1012 on the base 1001 overlaps at least partially with an orthogonal projection of a second reference electrode 1022 on the base 1001. The first reference electrode 1012, the second reference electrode 1022, and a portion of the first insulating layer 1002 therebetween form a reference capacitor $C_{RE}$.

It can be understood that, the orthogonal projections of the first reference electrode 1012 and the second reference electrode 1022 that constitute a same reference capacitor $C_{RE}$ on the base 1001 may overlap or coincide.

The number of the first reference electrode(s) 1012 is equal to the number of the second reference electrode(s) 1022.

An orthogonal projection of the reference capacitor $C_{RE}$ on the base 1001 is located in a non-bendable region Q2.

It can be understood that, the orthogonal projections of the first reference electrode 1012 and the second reference electrode 1022 that constitute the same reference capacitor $C_{RE}$ on the base 1001 are both located in a same non-bendable region Q2.

It will be noted that, a part of the non-bendable regions Q2 is not provided with a reference capacitor $C_{RE}$ therein, and another part of the non-bendable regions Q2 is provided with at least one reference capacitor $C_{RE}$ therein. A capacitance detected through the reference capacitor $C_{RE}$ is a capacitance of the non-bendable region Q2, which may be used as a reference capacitance.

It can be understood that, the detection capacitor $C_{DE}$ may be used to detect the capacitance of the bendable region Q1, and the reference capacitor $C_{RE}$ may be used to detect the capacitance of the non-bendable region Q2. For example, as shown in FIG. 3, the flexible substrate 10 has one bendable region Q1, and the bendable region Q1 has one detection capacitor $C_{DE}$. The flexible substrate 10 has two non-bendable regions Q2, and one of the two non-bendable regions Q2 has one reference capacitor $C_{RE}$. The capacitance detected through the detection capacitor $C_{DE}$ after the flexible substrate 10 is bent is $C_t$, and a capacitance detected through the reference capacitor $C_{RE}$ after the flexible substrate 10 is bent is $C_d$. In this case, the amount of change of capacitance of the bendable region Q1 before and after the bending may be obtained according to $C_t$ and $C_d$, and the bending information of the bendable region Q1 may be obtained according to the amount of change of capacitance of the bendable region Q1 before and after the bending.

In this case, since in the bending process of the flexible substrate 10, the capacitance of the non-bendable region Q2 may fluctuate due to influence of the bendable region Q1, if the capacitance detected through the detection capacitor $C_{DE}$ in the bendable region Q1 when the flexible substrate 10 is not bent is used as a reference, accuracy of the amount of change of capacitance of the detection capacitor $C_{DE}$ obtained before and after the flexible substrate 10 is bent will be affected. Therefore, the capacitance detected through the reference capacitor $C_{RE}$ after the flexible substrate 10 is bent is used as a reference, and is compared with the capacitance detected through the detection capacitor $C_{DE}$ after the flexible substrate 10 is bent, which may make the detected amount of change of capacitance accurate, and may improve an accuracy of the bending information.

In addition, in the case where the flexible substrate 10 is applied to the display panel, the reference capacitor $C_{RE}$ is disposed at a position at an edge of the flexible substrate 10 (i.e., a position at an edge of the display panel), which avoids affecting the normal display of the display panel.

In some embodiments, the first detection electrode 1011 and the second detection electrode 1021 are both strip-shaped electrodes. Extending directions of the first detection electrode 1011 and the second detection electrode 1021 that form the same detection capacitor $C_{DE}$ are the same or substantially the same.

For example, an extending direction of the detection capacitor $C_{DE}$ is the vertical direction Y in FIG. 3, and the extending directions of the first detection electrode 1011 and the second detection electrode 1021 that form the same detection capacitor $C_{DE}$ are both the vertical direction Y.

In this case, an overlapping area of the orthogonal projections of the first detection electrode 1011 and the second detection electrode 1021 that form the same detection capacitor $C_{DE}$ on the base 1001 is relatively large, which may increase the capacitance of the detection capacitor $C_{DE}$.

In a case where the first electrode layer 1010 includes at least one first reference electrode 1012, and the second electrode layer 1020 includes at least one second reference electrode 1022, the first reference electrode 1012 and the second reference electrode 1022 are both strip-shaped electrodes.

Extending directions of the first reference electrode 1012 and the second reference electrode 1022 that form the same reference capacitor $C_{RE}$ are the same or substantially the same.

For example, an extending direction of the reference capacitor $C_{RE}$ is the horizontal direction X in FIG. 3, and the extending directions of the first reference electrode 1012 and the second reference electrode 1022 that form the same reference capacitor $C_{RE}$ are both the horizontal direction X.

In this case, an overlapping area of the orthogonal projections of the first reference electrode 1012 and the second reference electrode 1022 that form the same reference capacitor $C_{RE}$ on the base 1001 is relatively large, which may increase the capacitance of the reference capacitor $C_{RE}$.

In some embodiments, as shown in FIG. 3, the bendable region Q1 is strip-shaped. An extending direction of the bendable region Q1 intersects with the extending direction of the first detection electrode 1011.

In this case, in the bending process of the flexible substrate 10, deformation of the detection capacitor $C_{DE}$ including the first detection electrode 1011 is relatively large, and a degree to which the capacitance of the detection capacitor $C_{DE}$ is changed is also relatively large, which may improve sensitivity of the detection capacitor $C_{DE}$.

For example, an included angle between the extending direction of the bendable region Q1 and the extending direction of the first detection electrode 1011 is in a range from 70° to 130°.

For example, an angle at which the extending direction of the bendable region Q1 intersects the extending direction of the first detection electrode 1011 is approximately 90°. That is, an angle (i.e., the included angle β in FIG. 3) at which the extending direction of the detection capacitor $C_{DE}$ including the first detection electrode 1011 intersects with the extending direction of the bendable region Q1 is approximately 90°. In this case, the deformation of the detection capacitor $C_{DE}$ including the first detection electrode 1011 is relatively large in the bending process of the flexible substrate 10, and the degree to which the capacitance of the detection capacitor $C_{DE}$ is changed is also relatively large. Therefore, the angle at which the extending direction of the bendable region Q1 intersects with the extending direction of the first detection electrode 1011, i.e., an angle at which the bendable region Q1 overlaps with the orthogonal projection of the first detection electrode 1011 on the base 1001, is approximately 90°, and the sensitivity of the detection capacitor $C_{DE}$ including the first detection electrode 1011 is relatively high.

In some embodiments, as shown in FIG. 3, in the case where the first electrode layer 1010 includes at least one first reference electrode 1012, and the second electrode layer 1020 includes at least one second reference electrode 1022, the extending direction of the bendable region Q1 is the same or substantially the same as the extending directions of the first reference electrode 1012 and the second reference electrode 1022 that form the same reference capacitor $C_{RE}$.

It can be understood that, the orthogonal projection of the reference capacitor $C_{RE}$ on the base 1001 does not overlap with the bendable region Q1.

In this case, in the bending process of the flexible substrate 10, stresses to which a first reference electrode 1012 and a second reference electrode 1022 that form a same reference capacitor $C_{RE}$ and are parallel to the extending direction of the bendable region Q1 are subjected are smaller than stresses to which a first detection electrode 1011 and a second detection electrode 1021 that form a same detection capacitor $C_{DE}$ and intersect with (e.g. is perpendicular to) the extending direction of the bendable region Q1 are subjected. Therefore, a stress to which the reference capacitor $C_{RE}$ is subjected is relatively small. Moreover, magnitudes of the stresses to which the first reference electrode 1012 and the second reference electrode 1022 that form the same reference capacitor $C_{RE}$ are subjected are approximately the same.

It will be noted that, in an actual product, a size of the bendable region Q1 and a size of the non-bendable region Q2 in the flexible substrate 10 are both limited. Extending lengths of the first detection electrode 1011 and the second detection electrode 1021 included in the detection capacitor $C_{DE}$ are also within a certain range, as long as the capacitance of the bendable region Q1 can be detected, and the first detection electrode 1011 and the second detection electrode 1021 do not need to be excessively extended. Extending lengths of the first reference electrode 1012 and the second reference electrode 1022 included in the reference capacitor $C_{RE}$ are also within a certain range, as long as the capacitance of the non-bendable region Q2 can be detected, and the first reference electrode 1012 and the second reference electrode 1022 do not need to be excessively extended.

Figure 5:
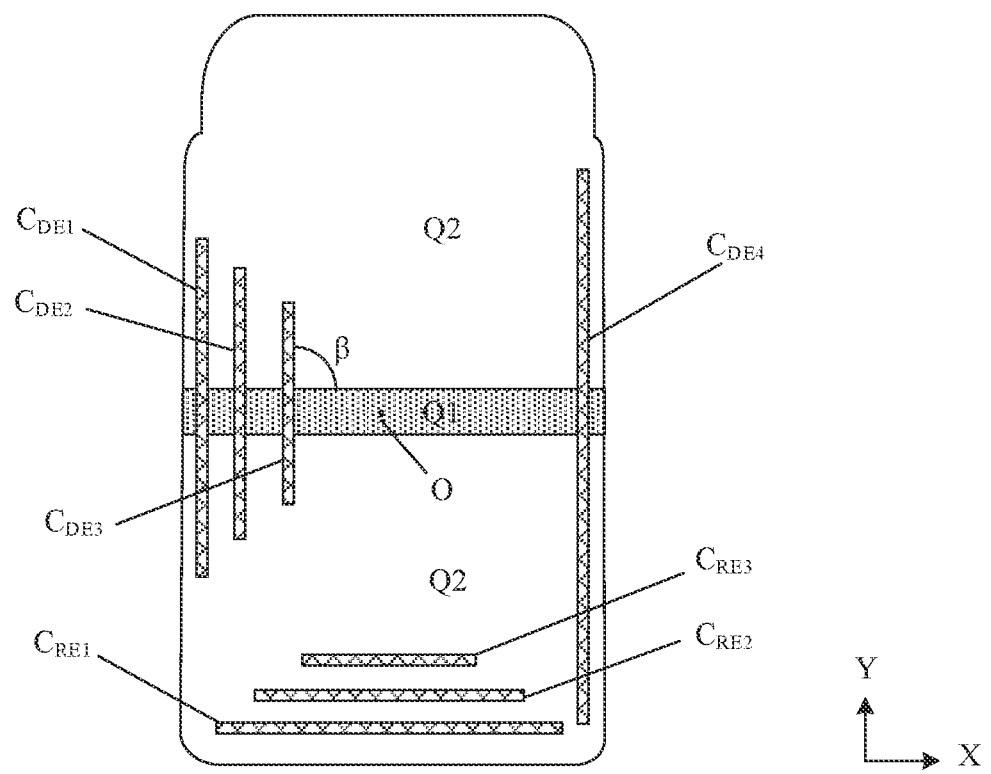
FIG. 5 is a diagram showing another structure of a flexible substrate, in accordance with some embodiments.

In some embodiments, as shown in FIG. 5, the flexible substrate 10 includes a plurality of detection capacitors $C_{DE}$.

For example, capacitance of the plurality of detection capacitors $C_{DE}$ orthogonal projections of which on the base overlap with the same bendable region Q1 may be averaged to obtain a magnitude of capacitance of the bendable region Q1, thereby reducing an error of the capacitance of the bendable region Q1.

One bendable region Q1 overlaps with orthogonal projections of at least two detection capacitors $C_{DE}$ on the base 1001.

Extending directions of the at least two detection capacitors $C_{DE}$ are the same or substantially the same, and the at least two detection capacitors $C_{DE}$ are disposed at interval (s).

The distance between two adjacent detection capacitors $C_{DE}$ is not exactly equal.

In the at least two detection capacitors $C_{DE}$, a length of a detection capacitor $C_{DE}$ relatively away from a center of the flexible substrate 10 in its extending direction is greater than a length of a detection capacitor $C_{DE}$ relatively proximate to the center of the flexible substrate 10 in its extending direction.

For example, as shown in FIG. 5, in a case where the flexible substrate 10 has one bendable region Q1 and two non-bendable regions Q2, in a direction perpendicular to an extending direction of the bendable region Q1 (i.e., in the vertical direction Y), the bendable region Q1 is located between the two non-bendable regions Q2. The flexible substrate 10 includes four detection capacitors $C_{DE}$. Extending directions of the four detection capacitors $C_{DE}$ are perpendicular to the extending direction of the bendable region Q1. The four detection capacitors $C_{DE}$ are a first detection capacitor $C_{DE1}$, a second detection capacitor $C_{DE2}$, a third detection capacitor $C_{DE3}$, and a fourth detection capacitor $C_{DE4}$, in order to reduce interference of the detection capacitors on the active area, the first detection capacitor $C_{DE1}$, the second detection capacitor $C_{DE2}$, and the third detection capacitor $C_{DE3}$ are all located on one of two opposite sides of the bendable region Q1 in its extending direction, and the fourth detection capacitor $C_{DE4}$ is located on the other side of the two opposite sides of the bendable region Q1 in its extending direction. The first detection capacitor $C_{DE1}$ is closer to the edge of the flexible substrate 10 than the second detection capacitor $C_{DE2}$, and the third detection capacitor $C_{DE3}$ is closer to the center of the flexible substrate 10 than the second detection capacitor $C_{DE2}$. Moreover, the fourth detection capacitor $C_{DE4}$ is closer to the edge of the flexible substrate 10 than the first detection capacitor $C_{DE1}$.

In this case, in the bending process of the flexible substrate 10, a stress to which a position of the bendable region Q1 proximate to the center of the flexible substrate 10 is subjected is relatively large. Therefore, in the first detection capacitor $C_{DE1}$, the second detection capacitor $C_{DE2}$, the third detection capacitor $C_{DE3}$, and the fourth detection capacitor $C_{DE4}$, sensitivity of a detection capacitor relatively proximate to the center of the flexible substrate 10 is relatively high, and sensitivity of a detection capacitor relatively proximate to the edge of the flexible substrate 10 is relatively low. Therefore, a length of the first detection capacitor $C_{DE1}$ is greater than a length of the second detection capacitor $C_{DE2}$, the length of the second detection capacitor $C_{DE2}$ is greater than the length of the third detection capacitor $C_{DE3}$, and a length of the fourth detection capacitor $C_{DE4}$ is greater than the length of the first detection capacitor $C_{DE1}$, which may ensure sensitivity of each detection capacitor, and may prevent the detection capacitors $C_{DE}$ from blocking a position of the center of the flexible substrate 10.

In some embodiments, as shown in FIG. 5, the flexible substrate 10 includes a plurality of reference capacitors $C_{RE}$.

For example, capacitance of multiple reference capacitors $C_{RE}$ located in the same non-bendable region Q2 may be averaged to obtain a magnitude of capacitance of the non-bendable region Q2, thereby avoiding influence of a stress to which the non-bendable region Q2 is subjected on the capacitance of the reference capacitors $C_{RE}$, and reducing an error of the capacitance of the non-bendable region Q2.

Extending directions of the plurality of reference capacitors $C_{RE}$ are the same or substantially the same. The plurality of reference capacitors $C_{RE}$ are disposed at intervals.

In the plurality of reference capacitors $C_{RE}$, a length of a reference capacitor $C_{RE}$ relatively away from the center of the flexible substrate 10 in its extending direction is greater than a length of a reference capacitor $C_{RE}$ relatively proximate to the center of the flexible substrate 10 in its extending direction.

For example, in the case where the flexible substrate 10 has one bendable region Q1 and two non-bendable regions Q2, in the direction perpendicular to the extending direction of the bendable region Q1, the bendable region Q1 is located between the two non-bendable regions Q2. The plurality of reference capacitors $C_{RE}$ are located in one of the two non-bendable regions Q2, or, the plurality of reference capacitors $C_{RE}$ are located in the two non-bendable regions Q2, and the numbers of reference capacitors $C_{RE}$ in the two non-bendable regions Q2 are not necessarily equal.

As shown in FIG. 5, in a case where the flexible substrate 10 includes three reference capacitors $C_{RE}$, and the three reference capacitors $C_{RE}$ are all located in one non-bendable region Q2, the three reference capacitors $C_{RE}$ are a first reference capacitor $C_{RE1}$, a second reference capacitor $C_{RE2}$, and a third reference capacitor $C_{RE3}$. The first reference capacitor $C_{RE1}$ is closer to the edge of the flexible substrate 10 than the second reference capacitor $C_{RE2}$, and the third reference capacitor $C_{RE3}$ is closer to the center of the flexible substrate 10 than the second reference capacitor $C_{RE2}$.

In the bending process of the flexible substrate 10, a stress to which a portion of the non-bendable region Q2 that is relatively proximate to the bendable region Q1 is large, and the bendable region Q1 is closer to the center of the flexible substrate 10 than the non-bendable region Q2. In this case, sensitivity of a reference capacitor relatively proximate to the center of the flexible substrate 10 is high, and sensitivity of a reference capacitor relatively away from the center of the flexible substrate 10 is low. Therefore, in the first reference capacitor $C_{RE1}$, the second reference capacitor $C_{RE2}$, and the third reference capacitor $C_{RE3}$, a length of the first reference capacitor $C_{RE1}$ is greater than a length of the second reference capacitor $C_{RE2}$, the length of the second reference capacitor $C_{RE2}$ is greater than a length of the third reference capacitor $C_{RE3}$, which may ensure sensitivity of each reference capacitor, and may prevent the reference capacitors $C_{RE}$ from blocking the position of the center of the flexible substrate 10.

Figure 6:
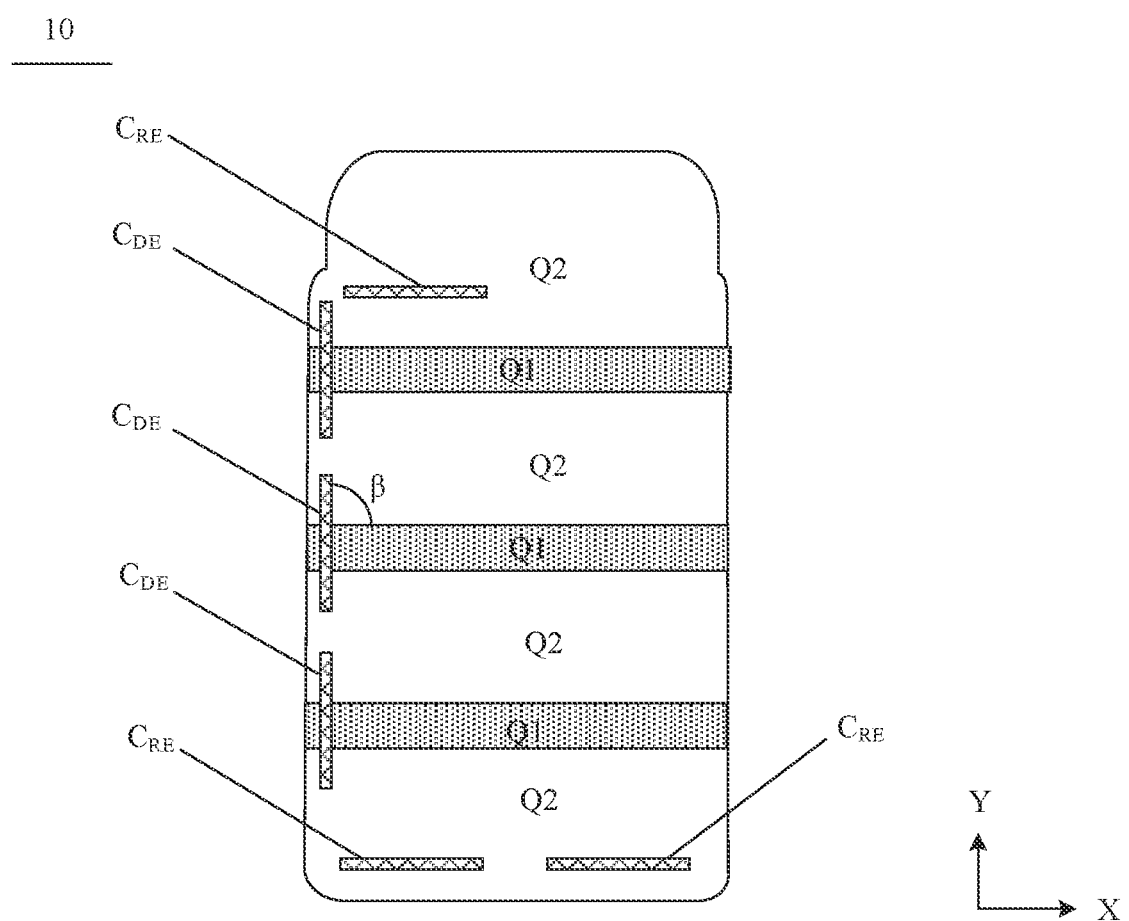
FIG. 6 is a diagram showing yet another structure of a flexible substrate, in accordance with some embodiments.

In some embodiments, as shown in FIG. 6, the flexible substrate 10 has a plurality of bendable regions Q1 arranged at intervals, and extending directions of the plurality of bendable regions Q1 are the same or substantially the same. For example, the plurality of bendable regions Q1 all extend in the horizontal direction X in FIG. 6.

The flexible substrate 10 includes a plurality of detection capacitors $C_{DE}$, and each bendable region Q1 overlaps with an orthogonal projection of at least one detection capacitor $C_{DE}$ on the base 1001.

For example, as shown in FIG. 6, the flexible substrate 10 has three bendable regions Q1 arranged at intervals, and the flexible substrate 10 includes three detection capacitors $C_{DE}$. An extending direction of the detection capacitors $C_{DE}$ is perpendicular to the extending direction of the bendable regions Q1, and an orthogonal projection of one detection capacitor $C_{DE}$ on the base 1001 overlaps with one bendable region Q1. In a case where distances between the three detection capacitors $C_{DE}$ and the edge of the flexible substrate 10 are substantially equal, lengths of the three detection capacitors $C_{DE}$ are substantially equal.

In some embodiments, as shown in FIG. 6, the flexible substrate 10 includes a plurality of reference capacitors $C_{RE}$, and the number of the plurality of reference capacitors $C_{RE}$ is the same as the number of the plurality of detection capacitors $C_{DE}$.

The plurality of reference capacitors $C_{RE}$ are located at two opposite sides of the plurality of bendable regions Q1 as a whole in a direction perpendicular to the extending direction of the bendable regions Q1.

For example, as shown in FIG. 6, the flexible substrate 10 has three bendable regions Q1 that are arranged at intervals and four non-bendable regions Q2 that are arranged at intervals. The bendable regions Q1 and the non-bendable regions Q2 are alternately distributed, and one bendable region Q1 is disposed between two adjacent non-bendable regions Q2. The flexible substrate 10 includes three reference capacitors $C_{RE}$. An extending direction of the reference capacitors $C_{RE}$ is parallel to the extending direction of the bendable regions Q1. In the direction perpendicular to the extending direction of the bendable regions Q1, one reference capacitor $C_{RE}$ of the three reference capacitors $C_{RE}$ is located at one of two opposite sides of the three bendable regions Q1 as a whole, i.e., located in one non-bendable region Q2 of two non-bendable regions Q2 proximate to the edges of the flexible substrate 10 in the four non-bendable regions Q2; and the other two reference capacitors $C_{RE}$ of the three reference capacitors $C_{RE}$ are located at the other one of the two opposite sides of the three bendable regions Q1 as a whole, i.e., located in the other non-bendable region Q2 of the two non-bendable regions Q2 proximate to the edges of the flexible substrate 10 in the four non-bendable regions Q2. Moreover, straight lines in which extending directions of the two reference capacitors $C_{RE}$ in the same non-bendable region Q2 are located are a same straight line.

It will be noted that, a person skilled in the art may design the numbers and distribution manners of the detection capacitors $C_{DE}$ and the reference capacitors $C_{RE}$ in the flexible substrate 10, such as the numbers of and a positional relationship between the bendable regions Q1 and the non-bendable regions Q2, according to actual conditions, which are not limited herein.

In some embodiments, the first detection electrode 1011 and the second detection electrode 1021 each have a plurality of through holes. For example, orthogonal projections of the through holes in the first detection electrode 1011 on the base 1001 coincide with orthogonal projections of the through holes in the second detection electrode 1021 on the base 1001.

In the case where the first electrode layer 1010 includes at least one first reference electrode 1012, and the second electrode layer 1020 includes at least one second reference electrode 1022, the first reference electrode 1012 and the second reference electrode 1022 each have a plurality of through holes.

For example, orthogonal projections of the through holes in the first reference electrode 1012 on the base 1001 coincide with orthogonal projections of the through holes in the second reference electrode 1022 on the base 1001.

It can be understood that, the first detection electrode 1011, the second detection electrode 1021, the first reference electrode 1012, and the second reference electrode 1022 are all patterned electrodes.

In this case, in the bending process, through the perforated structures, forces to which the first detection electrode 1011, the second detection electrode 1021, the first reference electrode 1012, and the second reference electrode 1022 are subjected may be buffered, bending resistances of the first detection electrode 1011, the second detection electrode 1021, the first reference electrode 1012 and the second reference electrode 1022 may be improved, and bending resistances of the detection capacitor $C_{DE}$ and the reference capacitor $C_{RE}$ may be improved.

Figure 7:
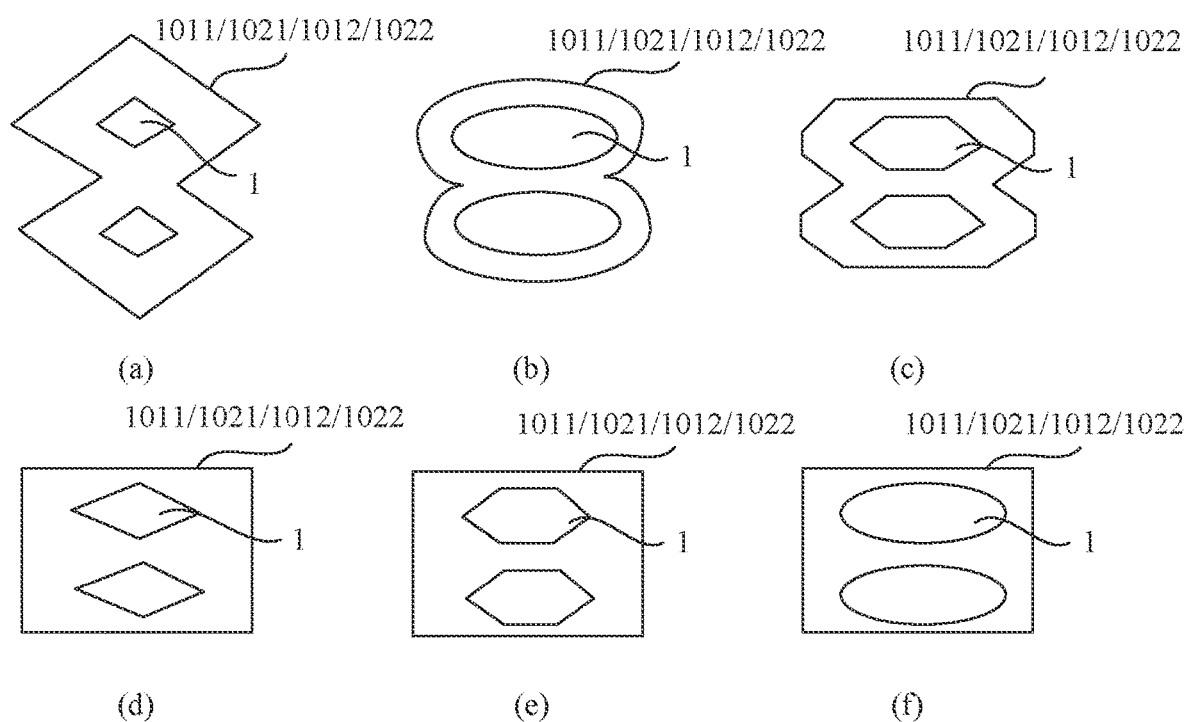
FIG. 7 is a diagram showing various structures of a first detection electrode, various structures of a second detection electrode, various structures of a first reference electrode and various structures of a second reference electrode, in accordance with some embodiments.

It will be noted that, a shape of each electrode and a shape of each through hole may be designed according to actual conditions, and are not limited herein. For example, shapes of edges of each of the first detection electrode 1011, the second detection electrode 1021, the first reference electrode 1012, and the second reference electrode 1022 may be irregular patterns shown in (a), (b) and (c) in FIG. 7, or may be a quadrangle shown in (d), (e) and (f) in FIG. 7. The shape of the through hole 1 may be a quadrangle shown in (a) and (d) in FIG. 7, a hexagon shown in (c) and (e) in FIG. 7, or an ellipse shown in (b) and (f) in FIG. 7.

In some embodiments, as shown in FIG. 4, the first insulating layer 1002 has flexibility. In this way, the flexible first insulating layer 1002 may buffer the forces to which the first detection electrode 1011, the second detection electrode 1021, the first reference electrode 1012, and the second reference electrode 1022 are subjected, thereby improving the bending resistances of the detection capacitor $C_{DE}$ and the reference capacitor $C_{RE}$.

For example, a material of the first insulating layer 1002 is the same as the material of the base 1001. In this way, it is possible to avoid cracks in the first insulating layer 1002 and avoid damage to the first insulating layer 1002 at a same time when the first insulating layer 1002 buffers the forces to which the electrodes are subjected, stabilities of the detection capacitor $C_{DE}$ and the reference capacitor $C_{RE}$ may be ensured, the sensitivities of the detection capacitor $C_{DE}$ and the reference capacitor $C_{RE}$ may be ensured, and signal-to-noise ratios of the capacitors may be improved.

Moreover, in a case where the material of the first insulating layer 1002 is the same as the material of the base 1001, the first insulating layer 1002 may be regarded as a portion of the base 1001. It is equivalent to that the first electrode layer 1010 is embedded in the base 1001, so that the base 1001 may protect the first detection electrode 1011 and the first reference electrode 1012 in the first electrode layer 1010. In this way, it is possible to avoid interference of other wires on the first detection electrode 1011 and the first reference electrode 1012 at a same time when the forces to which the first detection electrode 1011 and the first reference electrode 1012 are subjected in the bending process.

In some embodiments, as shown in FIG. 4, an orthogonal projection of the first electrode layer 1010 on the base 1001 is located within an orthogonal projection of the first insulating layer 1002 on the base 1001, and the first electrode layer 1010 is covered by the first insulating layer 1002. In this way, it is possible to prevent capacitance signals transmitted by the first detection electrode 1011 and the first reference electrode 1012 in the first electrode layer 1010 from being interfered by other wires.

In some embodiments, as shown in FIGS. 3 and 4, the flexible substrate 10 further includes a barrier layer 1003 disposed on a side of the second electrode layer 1020 away from the base 1001.

As shown in FIGS. 3 and 4, the flexible substrate 10 further includes a buffer layer 1004 disposed on a side of the barrier layer 1003 away from the second electrode layer 1020.

It will be noted that, a thickness of the barrier layer 1003 and a thickness of the buffer layer 1004 may be set according to actual conditions, and are not limited herein. For example, the thickness of the barrier layer 1003 is in a range from 100 nm to 900 nm, such as 300 nm, 500 nm, or 750 nm.

In this case, both the barrier layer 1003 and the buffer layer 1004 may ensure planarization of a surface of the flexible substrate 10, uniformity of film layers (e.g., film layers of the pixel circuit and film layers of the light-emitting device) formed on the surface of the flexible substrate 10 may be improved.

Figure 8:
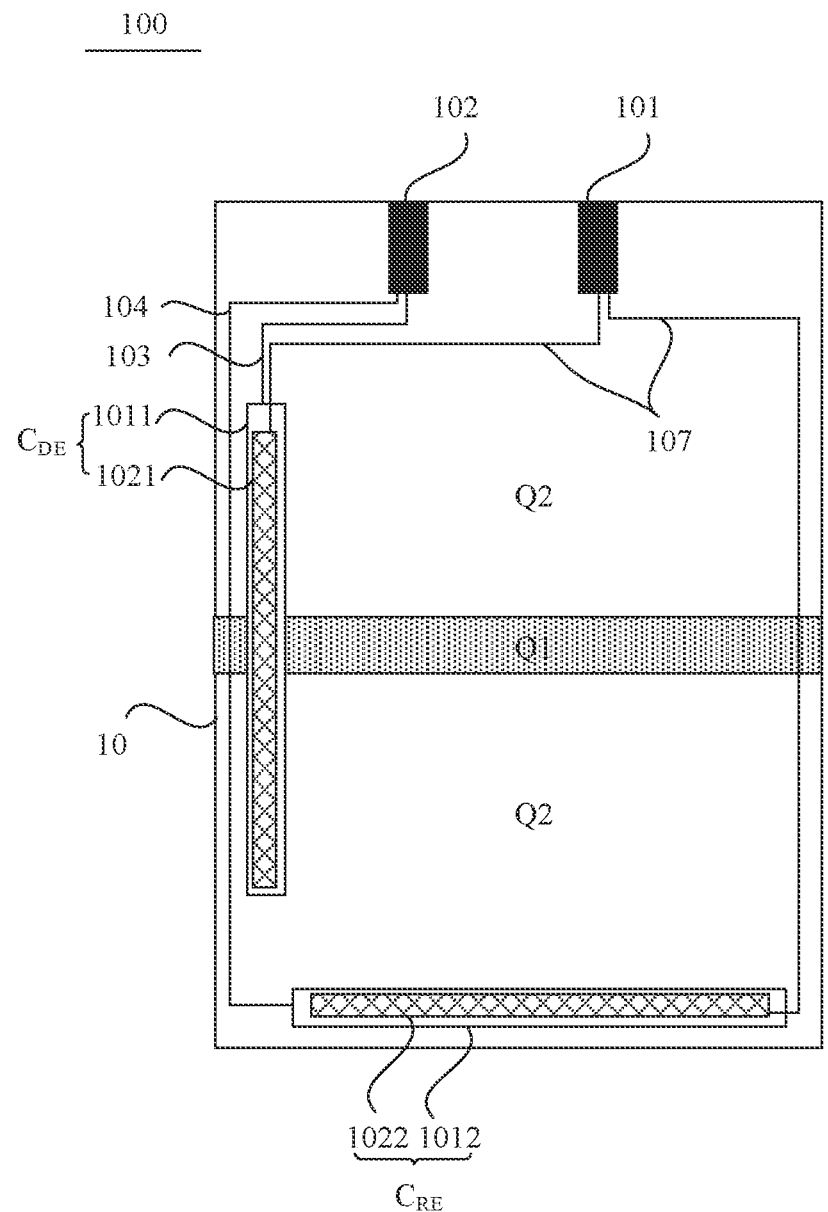
FIG. 8 is a diagram showing a structure of a display panel, in accordance with some embodiments.

Embodiments of the present disclosure provide a display panel 100. As shown in FIG. 8, the display panel 100 includes the flexible substrate 10 in any one of the above embodiments.

The display panel 100 further includes a common signal interface 101 and a detection signal interface 102 that are disposed on the flexible substrate 10.

The common signal interface 101 is configured to transmit a common signal.

It can be understood that, an electrode coupled to the common signal interface 101 may be an electrode of a detection capacitor or a reference capacitor in the flexible substrate. The electrode receives the common signal to form a capacitance with the other electrode of the detection capacitor or the reference capacitor.

One of the first detection electrode 1011 and the second detection electrode 1021 of the detection capacitor $C_{DE}$ in the flexible substrate 10 is coupled to the detection signal interface 102, and the other one is coupled to the common signal interface 101.

For example, the first detection electrode 1011 of the detection capacitor $C_{DE}$ is coupled to the detection signal interface 102, and the second detection electrode 1021 is coupled to the common signal interface 101. Or, the first detection electrode 1011 of the detection capacitor $C_{DE}$ is coupled to the common signal interface 101, and the second detection electrode 1021 is coupled to the detection signal interface 102.

It can be understood that, the detection capacitor $C_{DE}$ detects a capacitance signal of the bendable region Q1, and transmits the capacitance signal to the detection signal interface 102.

It will be noted that, the display panel 100 has same beneficial effects as the above flexible substrate 10, and details will not be repeated herein.

In some embodiments, as shown in FIG. 8, in a case where the flexible substrate 10 includes at least one reference capacitor $C_{RE}$, one of the first reference electrode 1012 and the second reference electrode 1022 in the reference capacitor $C_{RE}$ is coupled to the detection signal interface 102, and the other one is coupled to the common signal interface 101.

Moreover, electrodes in a same electrode layer are coupled to a same interface.

It can be understood that, in a case where the first detection electrode 1011 is coupled to the detection signal interface 102, and the second detection electrode 1021 is coupled to the common signal interface 101, the first reference electrode 1012 is coupled to the detection signal interface 102, and the second reference electrode 1022 is coupled to the common signal interface 101. In a case where the first detection electrode 1011 is coupled to the common signal interface 101, and the second detection electrode 1021 is coupled to the detection signal interface 102, the first reference electrode 1012 is coupled to the common signal interface 101, and the second reference electrode 1022 is coupled to the detection signal interface 102. In this way, it is possible to reduce signal interference of the electrodes in the same electrode layer, and simplify a film structure of the display panel.

In some embodiments, as shown in FIG. 8, the display panel 100 further includes at least one detection wire 103 disposed on the flexible substrate 10.

The detection wire 103 is configured to connect the detection signal interface 102 to the first detection electrode 1011 or the second detection electrode 1021 of the detection capacitor $C_{DE}$.

In the case where the flexible substrate 10 includes at least one reference capacitor $C_{RE}$, as shown in FIG. 8, the display panel 100 further includes at least one reference wire 104 disposed on the flexible substrate 10.

The reference wire 104 is configured to connect the detection signal interface 102 to the first reference electrode 1012 or the second reference electrode 1022 of the reference capacitor $C_{RE}$.

It will be noted that, the number of the detection wire(s) 103 is related to the number of the first detection electrode(s) 1011 or the number of the second detection electrode(s) 1021, and the number of the reference wire(s) 104 is related to the number of the first reference electrode(s) 1012 or the number of the second reference electrode(s) 1022.

In some embodiments, as shown in FIGS. 1 and 2, the display panel 100 further includes at least one TFT disposed on the flexible substrate 10. The TFT includes the active layer ACT, the gate G, the source S, the drain D, and a portion of the gate insulating layer GI disposed between the active layer ACT and the gate G, and a portion of an interlayer dielectric layer ILD disposed between the gate G and both the source S and the drain D.

The at least one TFT is located in the AA area.

For example, the TFT may be a TFT in a pixel circuit 201 in the display panel 100, or may be an additional TFT provided in the display panel 100.

Figure 9:
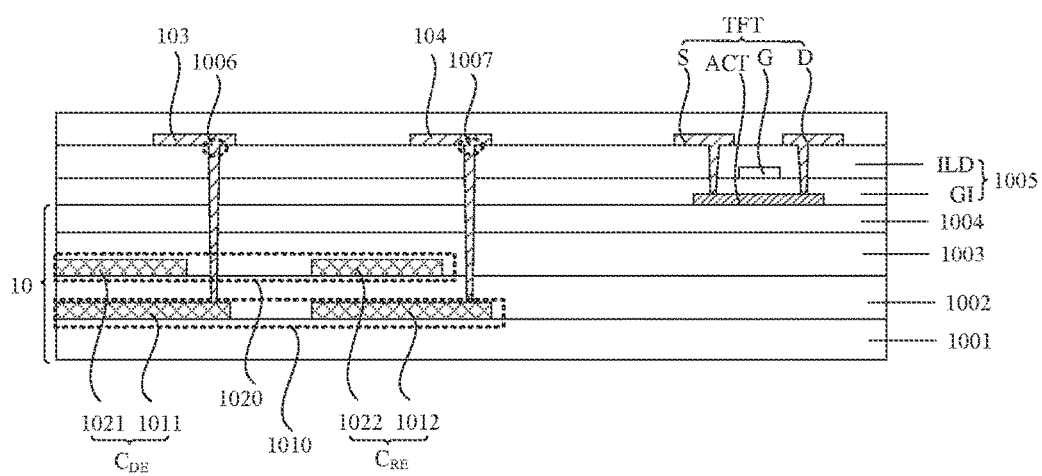
FIG. 9 is a diagram showing another structure of a display panel, in accordance with some embodiments.

As shown in FIG. 9, the detection wire 103 is disposed in a same layer and made of a same material as both the source S and the drain D in the TFT.

In terms of process, the detection wire 103 is formed synchronously with the source S and the drain D in the TFT, thereby simplifying manufacturing processes.

As shown in FIG. 9, the detection wire 103 is coupled to the first detection electrode 1011 or the second detection electrode 1021 through a first via hole 1006. The first via hole 1006 penetrates film layers between a film layer where the source S and the drain D are located and the first electrode layer 1010 or the second electrode layer 1020.

In a case where the TFT is a top-gate TFT, as shown in FIG. 9, the second insulating layer 1005 may include the gate insulating layer GI disposed between the active layer ACT and the gate G, and an interlayer dielectric layer ILD disposed between the gate G and both the source S and the drain D. In a case where the TFT is a bottom-gate TFT, the second insulating layer 1005 may include the gate insulating layer GI disposed between the active layer ACT and the gate G.

It can be understood that, in a case where the detection wire 103 is coupled to the first detection electrode 1011, the first via hole 1006 penetrates film layers between the film layer where the source S and the drain D are located and the first electrode layer 1010, and the film layers may include the interlayer dielectric layer ILD, the gate insulating layer GI, the buffer layer 1004, the barrier layer 1003 and the first insulating layer 1002, which case is shown in FIG. 9; and in a case where the detection wire 103 is coupled to the second detection electrode 1021, the first via hole 1006 penetrates film layers between the film layer where the source S and the drain D are located and the second electrode layer 1020, and the film layers may include the interlayer dielectric layer ILD, the gate insulating layer GI, the buffer layer 1004 and the barrier layer 1003.

In a case where the display panel 100 includes at least one reference wire 104, as shown in FIG. 9, the reference wire 104 is disposed in a same layer and made of a same material as both the source S and the drain D in the TFT.

In terms of process, the reference wire 104 is formed synchronously with the source S and the drain D in the TFT, thereby simplifying manufacturing processes.

As shown in FIG. 9, the reference wire 104 is coupled to the first reference electrode 1012 or the second reference electrode 1022 through a second via hole 1007. The second via hole 1007 penetrates the film layers between the film layer where the source S and the drain D are located and the first electrode layer 1010 or the second electrode layer 1020.

It can be understood that, in a case where the reference wire 104 is coupled to the first reference electrode 1012, the second via hole 1007 penetrates the film layers between the film layer where the source S and the drain D are located and the first electrode layer 1010; and in a case where the reference wire 104 is coupled to the second reference electrode 1022, the second via hole 1007 penetrates the film layers between the film layer where the source S and the drain D are located and the second electrode layer 1020.

It can be understood that, in the case where the reference wire 104 is coupled to the first reference electrode 1012, the second via hole 1007 penetrates the film layers between the film layer where the source S and the drain D are located and the first electrode layer 1010, and the film layers may include the interlayer dielectric layer ILD, the gate insulating layer GI, the buffer layer 1004, the barrier layer 1003 and the first insulating layer 1002, which case is shown in FIG. 9; and in the case where the reference wire 104 is coupled to the second reference electrode 1022, the second via hole 1007 penetrates the film layers between the film layer where the source S and the drain D are located and the second electrode layer 1020, and the film layers may include the interlayer dielectric layer ILD, the gate insulating layer GI, the buffer layer 1004 and the barrier layer 1003.

Moreover, the detection wire 103 and the reference wire 104 are disposed in the same layer as the source S and the drain D of the TFT, and the detection wire 103 and the reference wire 104 are both far away from the base 1001, thereby avoiding the signal interference and improving the signal-to-noise ratio.

In addition, the display panel 100 further includes common wires 107. The common wires 107 are coupled to the common signal interface 101, and configured to transmit common signals. One electrode in the detection capacitor $C_{DE}$ is coupled to the detection wire 103, and the other electrode is coupled to a common wire. One electrode in the reference capacitor $C_{RE}$ is coupled to the reference wire 104, and the other electrode is coupled to a common wire.

For example, the common wires 107 may be disposed in a same layer and made of a same material as the detection wire 103 and the reference wire 104. The common wires 107 may be coupled to the first detection electrode 1011 or the second detection electrode 1021 in the detection capacitor $C_{DE}$, and the first reference electrode 1012 or the second reference electrode 1022 in the reference capacitor $C_{RE}$ through the via holes penetrating the film layers between the film layer where the source S and the drain D are located and the first electrode layer 1010 or the second electrode layer 1020.

Figure 10:
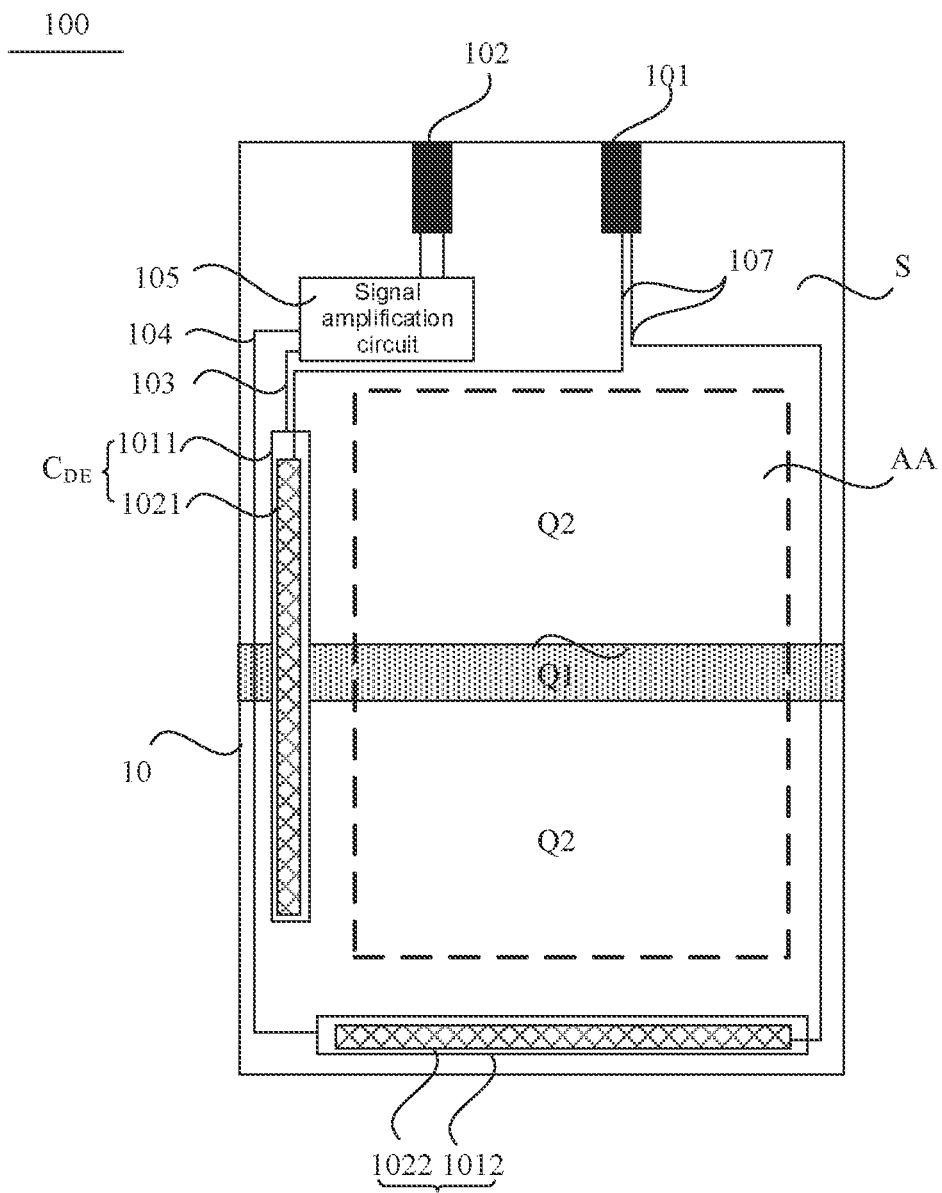
FIG. 10 is a diagram showing yet another structure of a display panel, in accordance with some embodiments.

In some embodiments, as shown in FIG. 10, the display panel 100 further includes at least one signal amplification circuit 105.

For example, the at least one signal amplification circuit 105 may be disposed on the flexible substrate 10. The at least one signal amplification circuit 105 is located in the frame area S of the display panel 100. Moreover, in terms of process, the at least one signal amplification circuit 105 may be manufactured simultaneously with the TFT.

For example, the at least one signal amplification circuit 105 may also be bonded to the flexible substrate 10 (not shown in the figure). In this way, it is possible to simplify a design of the display panel 100.

The detection wire 103 is coupled to the detection signal interface 102 through the signal amplification circuit 105.

In the case where the display panel 100 includes at least one reference wire 104, the reference wire 104 is coupled to the detection signal interface 102 through the signal amplification circuit 105.

It can be understood that, the signal amplification circuit 105 performs amplification processing on a signal transmitted by the detection wire 103, and transmits the amplified signal to the detection signal interface 102, and performs amplification processing on a signal transmitted by the reference wire 104, and transmits the amplified signal to the detection signal interface 102.

In some embodiments, the display panel 100 includes one signal amplification circuit 105. The detection wires 103 are coupled to the signal amplification circuit 105. The signal amplification circuit 105 is configured to sequentially perform amplification processing on signals from the detection wires 103 in a time-sharing manner. Moreover, in the case where the display panel 100 includes at least one reference wire 104, the signal amplification circuit 105 is further coupled to the reference wire(s) 104. The signal amplification circuit 105 is configured to sequentially perform amplification processing on signal(s) from the reference wire(s) 104 in a time-sharing manner. In this way, it is possible to simplify a circuit design of the display panel 100.

Figure 11:
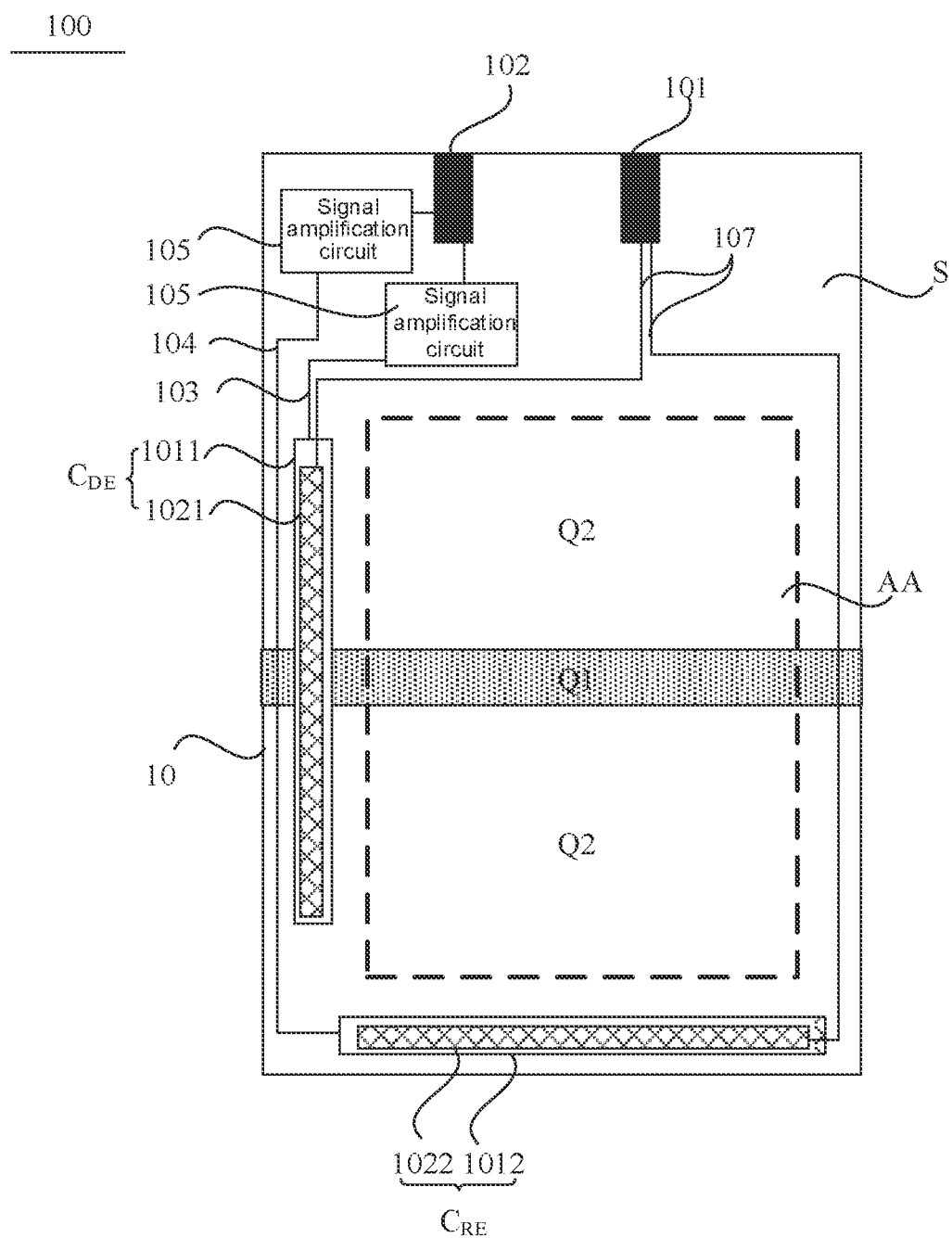
FIG. 11 is a diagram showing yet another structure of a display panel, in accordance with some embodiments.

In some embodiments, as shown in FIG. 11, the display panel 100 includes a plurality of signal amplification circuits 105. Each detection wire 103 is connected to a signal amplification circuit 105. Moreover, in the case where the display panel 100 includes at least one reference wire 104, each reference wire 104 is connected to a signal amplification circuit 105. A signal amplification circuit 105 is configured to perform amplification processing on a signal from a detection wire 103 or a reference wire 104 to which it is coupled. In this way, it is possible to avoid interference of the amplification processing performed on the signal by the signal amplification circuit 105, and improve accuracy of the amplification processing performed on the signal.

It will be noted that, wiring manners of the detection wires 103 and the reference wires 104 may be designed according to actual conditions, and are not limited in the present disclosure herein.

In addition, the display panel 100 further includes a neutral layer. The neutral layer is a film layer that is neither stretched nor compressed in a bending process of the display panel 100, and a stress to which the neutral layer is subjected in the bending process is approximately zero. The neutral layer may be located in the bendable region Q1. In this case, the neutral layer is generally provided with devices that are easily affected by stress or external force, such as the light-emitting devices EL, thereby avoiding damage to the devices by the stress or the external force. Moreover, since the detection capacitor $C_{DE}$ is integrated in the flexible substrate 10, it is possible to prevent the detection capacitor $C_{DE}$, from occupying the neutral layer of the display panel 100.

Figure 12:
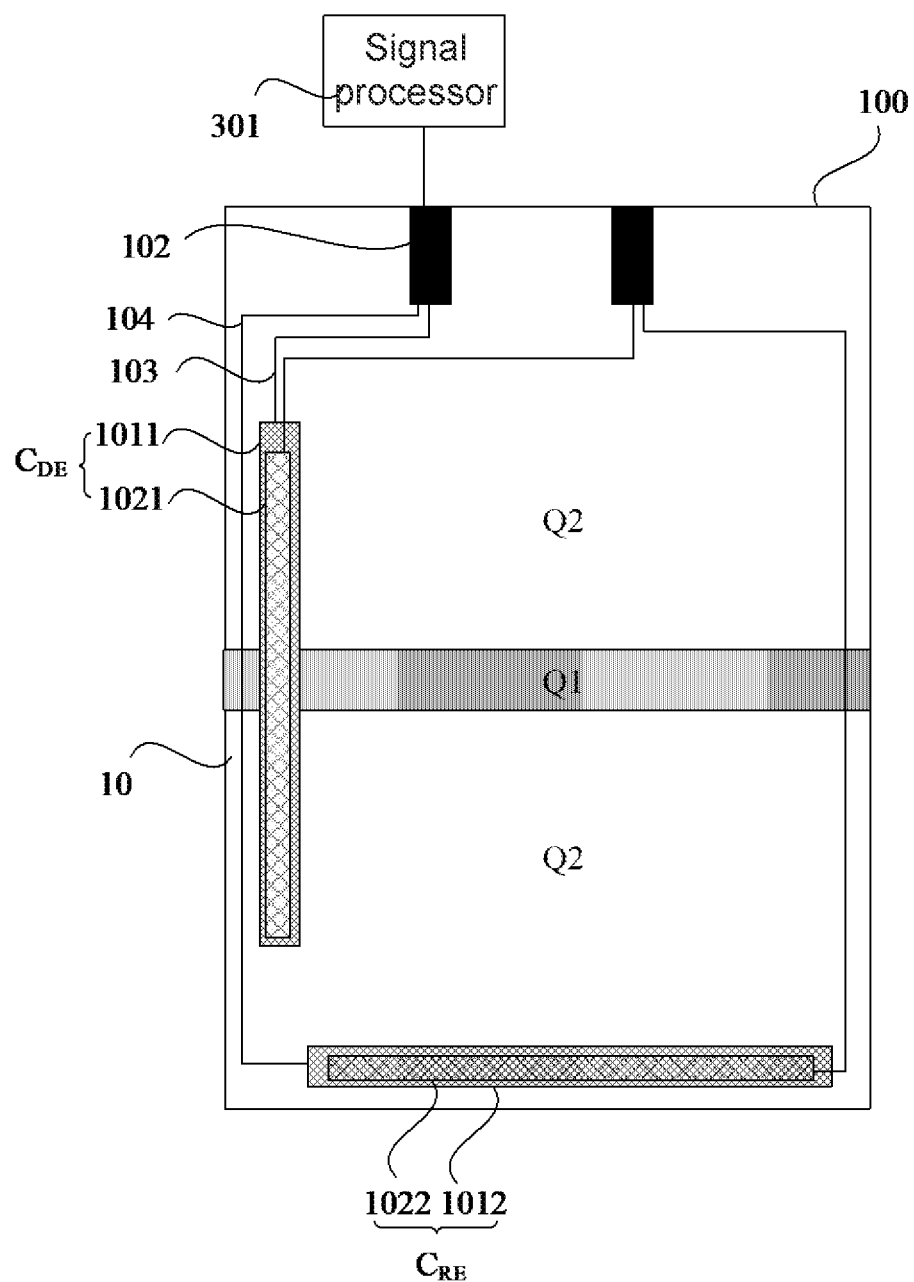
FIG. 12 is a diagram showing another structure of a display apparatus, in accordance with some embodiments.

Embodiments of the present disclosure provide a display apparatus 300. As shown in FIG. 12, the display apparatus 300 includes the display panel 100 in any one of the above embodiments and a signal processor 301.

The signal processor 301 is coupled to the detection signal interface 102 in the display panel 100.

The signal processor 301 is configured to receive detection signals transmitted by the detection signal interface 102, obtain an amount of change of a capacitance of at least one detection capacitor $C_{DE}$ in the display panel 100 according to the detection signals, and obtain a bending angle of the display panel 100 according to the amount of change of the capacitance.

It can be understood that, the amount of change of the capacitance of the detection capacitor $C_{DE}$ is the amount of change of the capacitance of the detection capacitor $C_{DE}$ before and after the bending. In this way, bending information of at least one bendable region Q1 in the display panel 100 may be monitored through the signal processor 301.

For example, in a case where the display panel 100 includes the signal amplification circuit 105, the signal amplification circuit 105 transmits the amplified signal to the detection signal interface 102, which may reduce complexity of signal processing by the signal processor 301.

Therefore, as for the display apparatus 300 in the embodiments of the present disclosure, in the bending process of the display panel 100, the bending angle of the display panel 100 may be obtained according to the amount of change of the capacitance of the detection capacitor $C_{DE}$ before and after the bending through the detection capacitor $C_{DE}$ in the flexible substrate 10 in the display panel 100. Thereby, the display apparatus 300 may detect the bending information in a process of flexible display, and diversification of functions of the display apparatus 300 may be achieved. Moreover, since the detection capacitor $C_{DE}$ is disposed in the flexible substrate 10, the display apparatus 300 may be made light and thin.

In some embodiments, the display panel 100 has a plurality of bendable regions Q1. The display panel 100 includes a plurality of detection capacitors $C_{DE}$. Each bendable region Q1 overlaps with an orthogonal projection of at least one detection capacitor $C_{DE}$ on the base 1001. The signal processor 301 is further configured to obtain a bending position of the display panel 100 according to an amount of change of a capacitance of each detection capacitor $C_{DE}$ and position information of each detection capacitor $C_{DE}$.

It can be understood that, the signal processor 301 obtains detection capacitor(s) $C_{DE}$ that are bent in the detection capacitors $C_{DE}$ according to the amount of change of the capacitance of each detection capacitor $C_{DE}$, and obtains the bending position of the display panel 100 according to position information of the detection capacitor(s) $C_{DE}$ that are bent.

For example, the signal processor 301 may be integrated in a driver chip. An interface for receiving capacitance signals in the driver chip is coupled to the detection signal interface 10 in the display panel 100. In a case where the driver chip further includes the data driving circuit 2102, the driver chip may not only drive the display panel 100 to display an image, but also detect the bending information of the display panel 100.

Figure 14:
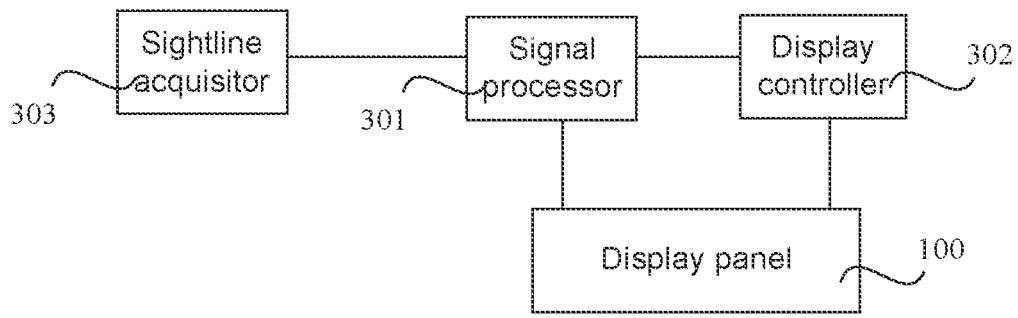
FIG. 14 is a diagram showing yet another structure of a display apparatus, in accordance with some embodiments.

In some embodiments, as shown in FIG. 14, the display apparatus 300 further includes a display controller 302 and a sightline acquisitor 303.

The display controller 302 is coupled to the signal processor 301 and the display panel 100.

The sightline acquisitor 303 is coupled to the signal processor 301.

The sightline acquisitor 303 is configured to acquire information of a direction of a sightline of a user, and send the acquired information of the direction of the sightline to the signal processor 301.

For example, the sightline acquisitor 303 may include an eyeball tracker. The sightline acquisitor 303 may be disposed on a front face of the display apparatus 300, for example, the sightline acquisitor 303 may be disposed in a region where a front camera is located, so that the sightline acquisitor 303 may acquire the information of the direction of the sightline of the user when the user views the display apparatus 300 normally.

The signal processor 301 is further configured to receive the information of the direction of the sightline, and obtain display position control information or display brightness control information according to the bending angle and the bending position of the display panel 100 and the information of the direction of the sightline.

It can be understood that, in the bending process of the display panel 100, the bending angle is continuously changed as a viewing angle of the user relative to a portion of the display panel 100 that is turned up is continuously changed. Therefore, according to the direction of the sightline of the user and taking the direction of the sightline of the user as a reference, the signal processor 301 obtains the display position control information or the display brightness control information according to the information of the direction of the sightline of the user and the bending position information and the bending angle of the display panel 100.

The display controller 302 is configured to obtain the display position control information, and control the display panel 100 to display an image at a position indicated by the display position control information; or to obtain the display brightness control information, and control the display panel 100 to display an image having a brightness indicated by the display brightness control information.

It can be understood that, in the bending process of the display panel 100, the sightline acquisitor 303 acquires the information of the direction of the sightline of the user, and the signal processor 400 determines which region of the display panel the sightline of the user falls in according to the acquired information of the direction of the sightline of the user.

Figure 13:
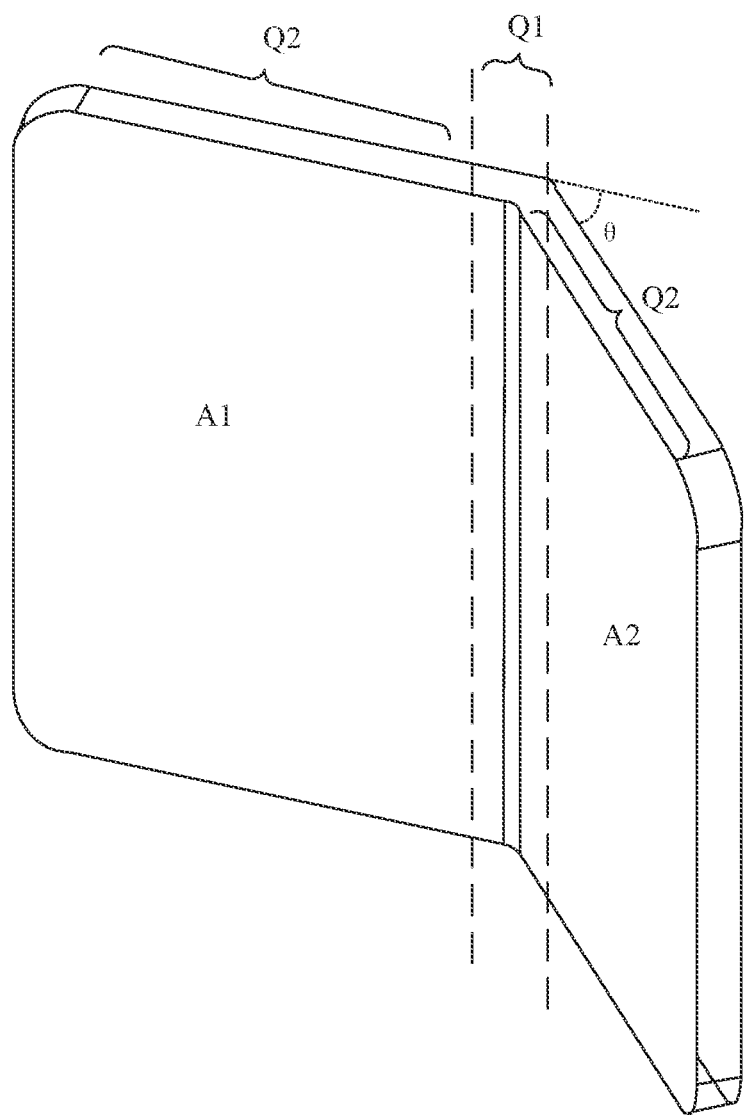
FIG. 13 is a diagram of a display panel being in a bent state, in accordance with some embodiments.

As shown in FIG. 13, the display panel 100 has one bendable region Q1, and the bendable region Q1 divides the active area of the display panel 100 into a first sub-region A1 and a second sub-region A2. In a case where the display panel 100 is not bent, the display panel 100 is in a flat display state, and in this case, the display panel 100 is in a full-screen display state. In the bending process of the display panel 100, as the bending angle increases (e.g., the bending angle θ in FIG. 13 increasing to 45°), in a case where the viewing angle of the user is unchanged, a brightness of an image displayed in a region (e.g., the second sub-region A2 in FIG. 13) of the display panel 100 that is turned up due to the bending is reduced, which causes that when the user views an image displayed in the first sub-region A1, the brightness of the viewed image displayed in the second sub-region A2 is low, or the image cannot even be viewed.

In this case, the display controller 302 may control the display panel 100 to perform local display, so that the image displayed by the display panel 100 is located in a region of the display panel 100 that is not bent or a portion of the display panel 100 that is not turned up due to the bending. In this way, in a case where the viewing angle (a viewing angle or a direction of the sightline in the plane display state) of the user is not changed, all contents of the image displayed by the display panel 100 may be completely viewed in a local active area, and a problem that the user cannot view the image normally due to the bending of the display panel 100 is avoided. In addition, in the bending process of the display panel 100, the display controller 302 may adjust a display brightness of the portion of the display panel 100 that is turned up due to the bending according to the bending angle, so that the display brightness of the portion that is turned up increases with the increase of the bending angle, and a problem that a display brightness of a part of the active area of the display panel 100 is reduced due to the bending of the display panel 100 is avoided.

For example, as shown in FIG. 13, in a case where the bending angle θ is large (e.g., the bending angle being an obtuse angle), the user may clearly view the image displayed in the first sub-region A1, but cannot view the image displayed in the second sub-region A2. In this case, the signal processor 301 may obtain the display position control information according to the acquired information of the direction of the sightline of the user, and the bending angle and the bending position of the display panel 100, so as to control the display panel 100 to display an image in the first sub-region A1. In this case, when the sightline of the user falls in the first sub-region A1, it is possible to ensure that the user clearly views the image.

In a case where the bending angle θ is small (e.g., the bending angle being an acute angle), although the user can view the image displayed in the second sub-region A2, since directions in which the sightline of the user is directed to the first sub-region A1 and the second sub-region A2 are different, the brightness of the image displayed in the second sub-region A2 viewed by the user decreases compared to a brightness of the image displayed in the first sub-region A1. In this case, the signal processor 302 obtains the display brightness control information according to the direction of the sightline of the user and the bending position and bending angle of the display panel, so as to control the brightness of the image displayed in the second sub-region A2 to improve the brightness of the image displayed in the second sub-region A2. In this case, in a case where the sightline of the user is directed to the first sub-region A1, it is possible to ensure that the brightness of the image displayed in the second sub-region A2 viewed by the user is equal or substantially equal to the brightness of the image displayed in the first sub-region A1 viewed by the user, so that the user can clearly view the image displayed in the second sub-region A2.

Figure 15:
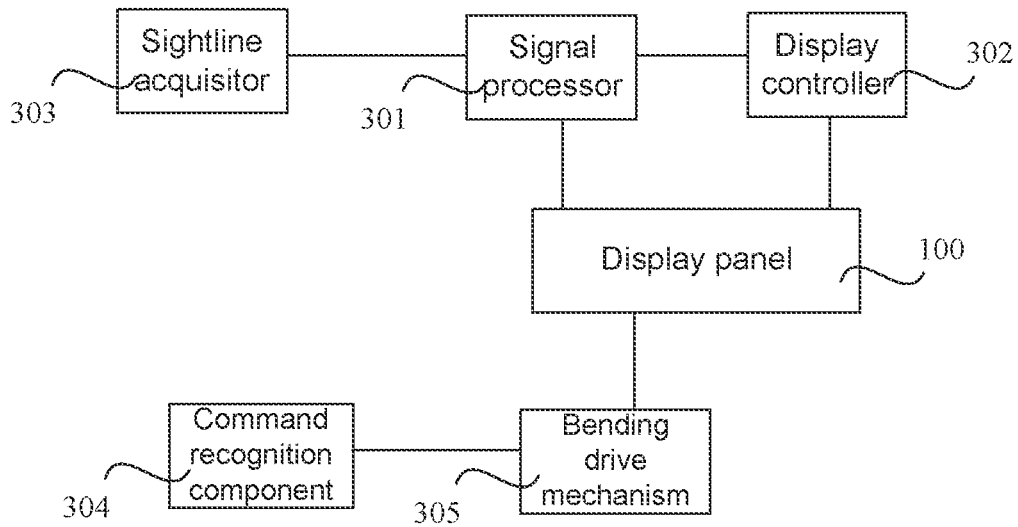
FIG. 15 is a diagram showing yet another structure of a display apparatus, in accordance with some embodiments.

In some embodiments, as shown in FIG. 15, the display apparatus 300 further includes a command recognition component 304 and a bending drive mechanism 305.

The command recognition component 304 is configured to recognize a user command.

The bending drive mechanism 305 is coupled to the command recognition component 304.

The bending drive mechanism 305 is configured to drive the display panel 100 to bend according to the user command, and control the display pan& 100 to stop bending in a case where the bending angle of the display panel 100 reaches a preset angle.

For example, the command recognition component 304 may be a speech recognizer for recognizing a speech of the user, or a sensor for recognizing a gesture of the user. The speech recognizer may be a speech interpretation & recognition interface (Siri) speech recognizer to support natural language input. The Siri speech recognizer may invoke applications (e.g., a weather forecast application, a schedule application, and a data search application) in a display device such as a mobile phone, and update voice and intonation of the speech to provide a conversational response for the user, thereby achieving intellectualization, and improving human-computer interaction experience.

The bending drive mechanism 305 may be an electronic hinge including an electronic hinge.

In this case, the command recognition component 304 recognizes the user command. For example, the user command is a speech that "please open to 75°, and I need to watch a movie". The bending drive mechanism 305 drives the display panel 100 to bend according to the user command. The signal processor 301 obtains the bending angle of the display panel 100 according to the amount of change of the capacitance of the at least one detection capacitor $C_{DE}$ in the display panel 100. When the bending angle reaches 75°, the signal processor 301 transmits a command to stop bending to the bending drive mechanism 305, so that the bending drive mechanism 305 controls the display panel 100 to stop bending.

After the display panel 100 stops bending, the signal processor 301 obtains the display position control information or the display brightness control information. The display controller 302 obtains the display position control information, and controls the display panel 100 to display an image at the position indicated by the display position control information; or obtains the display brightness control information, and controls the display panel 100 to display an image having the brightness indicated by the display brightness control information, so that the display panel 100 plays the movie.

It will be noted that, the bending angle of the display panel 100 refers to an included angle between a plane where the portion of the display panel 100 that is turned up due to the bending is located and a plane where the portion of the display panel 100 that is not turned up is located, for example, an included angle θ between a plane where the second sub-region A2 is located and a plane where the first sub-region A1 is located in the display panel 100 in FIG. 13.

Embodiments of the present disclosure provide a method for manufacturing the display panel 100 in any one of the above embodiments. The display panel 100 has at least one bendable region Q1.

For example, the display panel 100 may be manufactured by means of a combination of a film-forming process and an etching process. The film-forming process may include a magnetron sputtering process, a vacuum evaporation process or other film-forming processes. The etching process may include a wet etching process, a dry etching process or other etching processes.

Figure 16:
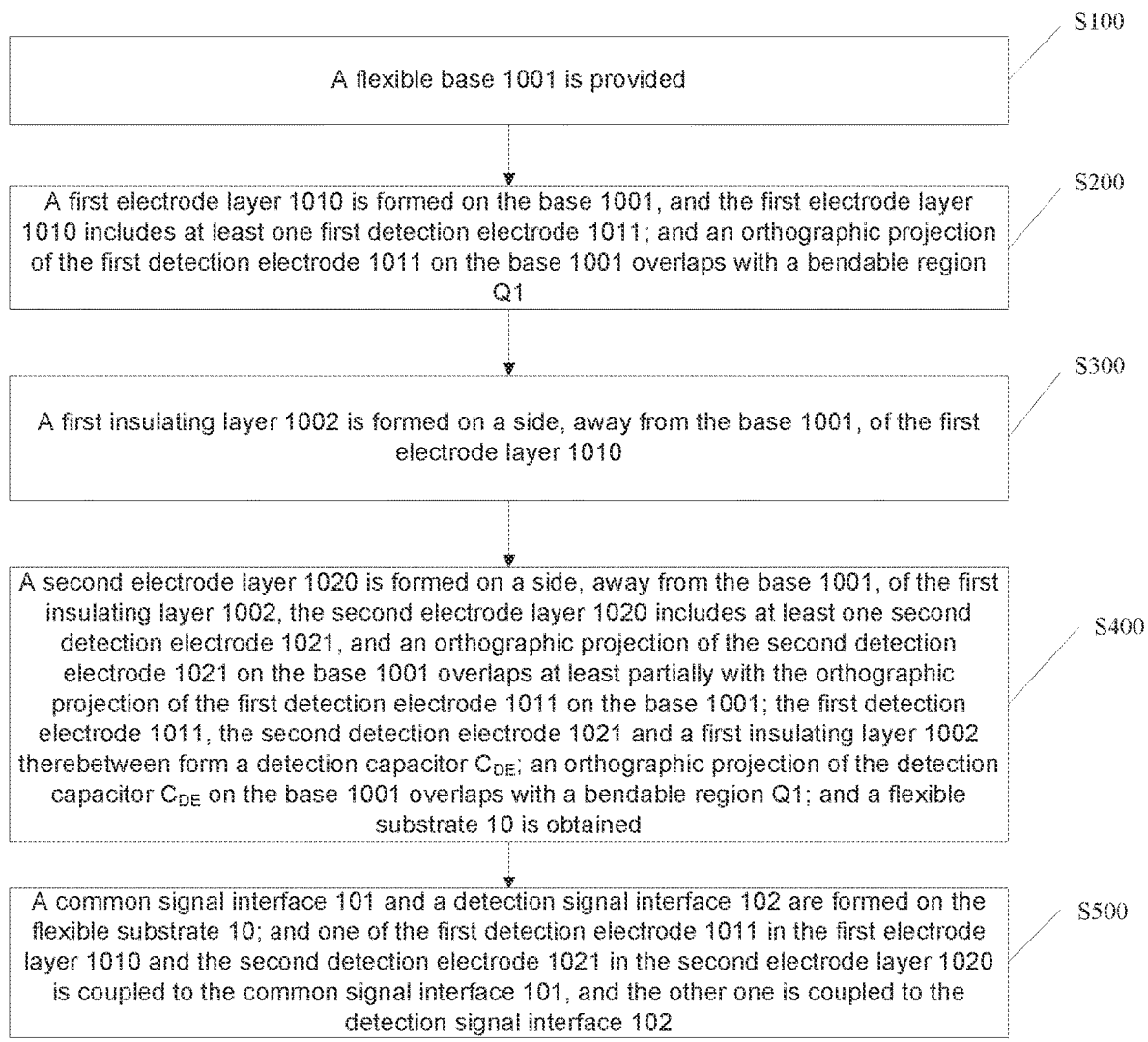
FIG. 16 is a flow diagram of manufacturing a display panel, in accordance with some embodiments.

As shown in FIG. 16, the method for manufacturing the display panel 100 includes the following steps.

In S100, a flexible base 1001 is provided.

It will be noted that, the base 1001 is generally formed on a rigid substrate such as glass. The rigid substrate may carry the base 1001 to ensure normal manufacturing of the display panel 100.

For example, the base 1001 may be made of one polyimide film, or two or more polyimide films.

In S200, a first electrode layer 1010 is formed on the base 1001. The first electrode layer 1010 includes at least one first detection electrode 1011, and an orthogonal projection of the first detection electrode 1011 on the base 1001 overlaps with a bendable region Q1.

For example, a conductive material is deposited on the base 1001 to form a conductive film, and then the conductive film is patterned by using a patterning process such as photolithography to form the first electrode layer 1010 including at least one first detection electrode 1011.

In S300, a first insulating layer 1002 is formed on a side of the first electrode layer 1010 away from the base 1001.

For example, a material of the first insulating layer 1002 may be an insulating material having no flexibility, or an insulating material having flexibility.

The first insulating layer 1002 may cover the first electrode layer 1010 to avoid signal interference of other circuits on the first electrode layer 1010.

In S400, a second electrode layer 1020 is formed on a side of the first insulating layer 1002 away from the base 1001, the second electrode layer 1020 including at least one second detection electrode 1021, an orthogonal projection of the second detection electrode 1021 on the base 1001 overlapping at least partially with the orthogonal projection of the first detection electrode 1011 on the base 1001, the first detection electrode 1011, the second detection electrode 1021 and a portion of a first insulating layer 1002 therebetween forming a detection capacitor $C_{DE}$, an orthogonal projection of the detection capacitor $C_{DE}$ on the base 1001 overlapping with the bendable region Q1; and a flexible substrate 10 is obtained.

In S500, a common signal interface 101 and a detection signal interface 102 are formed on the flexible substrate 10. One of the first detection electrode 1011 in the first electrode layer 1010 and the second detection electrode 1021 in the second electrode layer 1020 is coupled to the common signal interface 101, and the other one is coupled to the detection signal interface 102.

It will be noted that, beneficial effects of the method for manufacturing the display panel 100 provided by the embodiments of the present disclosure are the same as the beneficial effects of the display panel 100, and details will not be repeated herein.

It will be noted that, before the flexible substrate 10 is obtained, the method for manufacturing the display panel 100 further includes: forming a barrier layer 1003 on a side of the second electrode layer 1020 away from the base 1001, and forming a buffer layer 1004 on a side of the barrier layer 1003 away from the base 1001.

In some embodiments, the display panel 100 further includes at least one non-bendable region Q2, and the step of forming the first electrode layer 1010 on the base 1001 further includes: forming at least one first reference electrode 1012. The at least one first reference electrode 1012 is insulated from the at least one first detection electrode 1011, and an orthogonal projection of the at least one first reference electrode 1012 on the base 1001 is located in a non-bendable region Q2.

The step of forming the second electrode layer 1020 on the side of the first insulating layer 1002 away from the base 1001 further includes: forming at least one second reference electrode 1022. The at least one second reference electrode 1022 is insulated from the at least one second detection electrode 1021, an orthogonal projection of a second reference electrode 1022 on the base 1001 overlaps at least partially with an orthogonal projection a first reference electrode 1012 on the base 1001. The first reference electrode 1012, the second reference electrode 1022 and a portion of a first insulating layer 1002 therebetween form a reference capacitor $C_{RE}$. An orthogonal projection of the reference capacitor $C_{RE}$ on the base 1001 is located in a non-bendable region Q2.

Figure 17:
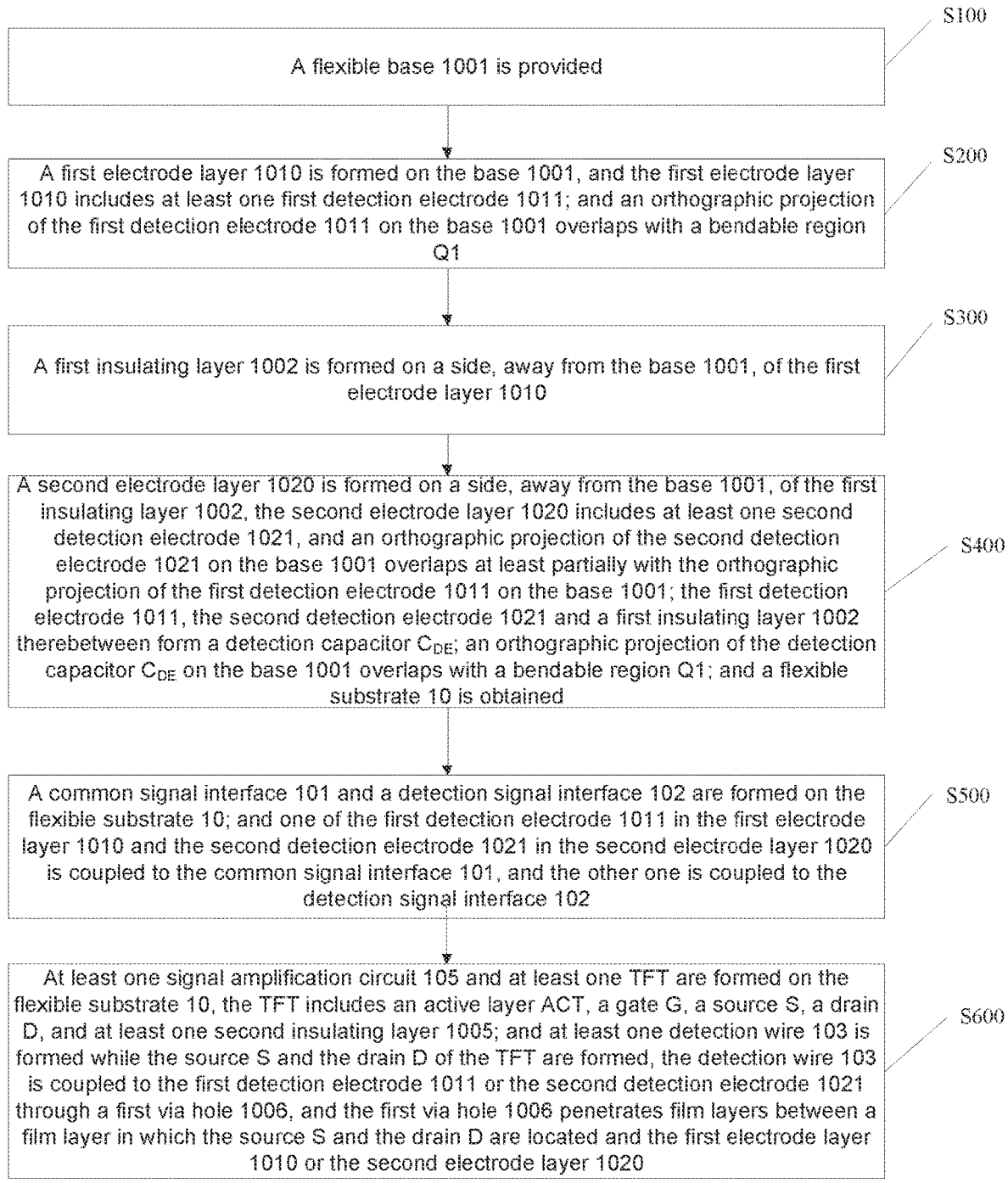
FIG. 17 is another flow diagram of manufacturing a display panel, in accordance with some embodiments.

In some embodiments, as shown in FIG. 17, the method for manufacturing the display panel 100 further includes:

S600, forming at least one signal amplification circuit 105 and at least one TFT on the flexible substrate 10, the TFT including an active layer ACT, a gate G, a source S, a drain D, a portion of the gate insulating layer GI disposed between the active layer ACT and the gate G, and a portion of an interlayer dielectric layer ILD disposed between the gate G and both the source S and the drain D; and forming at least one detection wire 103 while forming the source S and the drain D of the TFT, the detection wire 103 being coupled to the first detection electrode 1011 or the second detection electrode 1021 through a first via hole 1006, and the first via hole 1006 penetrating film layers between a film layer where the source S and the drain D are located and the first electrode layer 1010 or the second electrode layer 1020.

It can be understood that, in a case where the detection wire 103 is coupled to the first detection electrode 1011, the first via hole 1006 penetrates film layers between the film layer where the source S and the drain D are located and the first electrode layer 1010, and the film layers may include an interlayer dielectric layer, a gate insulating layer, the buffer layer, the barrier layer and the first insulating layer; and in a case where the detection wire 103 is coupled to the second detection electrode 1021, the first via hole 1006 penetrates film layers between the film layer where the source S and the drain D are located and the second electrode layer 1020, and the film layers may include the interlayer dielectric layer ILD, the gate insulating layer GI, the buffer layer 1004 and the barrier layer 1003.

In some embodiments, in a case where the flexible substrate 10 includes at least one reference capacitor $C_{RE}$, the method for manufacturing the display panel 100 further includes: forming at least one reference wire 104 while forming the source S and the drain D of the TFT, the reference wire 104 being coupled to the first reference electrode 1012 or the second reference electrode 1022 through a second via hole 1007. The second via hole 1007 penetrates the film layers between the film layer where the source S and the drain D are located and the first electrode layer 1010 or the second electrode layer 1020.

It can be understood that, in a case where the reference wire 104 is coupled to the first reference electrode 1012, the second via hole 1007 penetrates the film layers between the film layer where the source S and the drain D are located and the first electrode layer 1010; and in a case where the reference wire 104 is coupled to the second reference electrode 1022, the second via hole 1007 penetrates the film layers between the film layer where the source S and the drain D are located and the second electrode layer 1020.

In this case, after the source S and the drain D of the TFT are formed, the signal amplification circuit 150 is formed, and the signal amplification circuit 150 is coupled to the detection wire 103 and the reference wire 104.

It will be noted that, after the TFT is formed, the method for manufacturing the display panel 100 further includes forming light-emitting devices EL. Moreover, before the light-emitting devices EL are formed, there is a need to form a planarization layer PLN on a side of the TFT away from the flexible substrate 10, so as to planarize a surface of the TFT away from the flexible substrate 10.

The forgoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A flexible substrate having at least one bendable region, the flexible substrate comprising:
    a flexible base;
    a first electrode layer disposed on the base, the first electrode layer including at least one first detection electrode;
    a first insulating layer disposed on a side of the first electrode layer away from the base; and
    a second electrode layer disposed on a side of the first insulating layer away from the base, the second electrode layer including at least one second detection electrode, wherein
    an orthogonal projection of a first detection electrode on the base overlaps at least partially with an orthogonal projection of a second detection electrode on the base;
    a region where orthogonal projections of the first detection electrode and the second detection electrode on the base are located overlaps with a bendable region; and
    a material of the first insulating layer is the same as a material of the base.

2. The flexible substrate according to claim 1, wherein the flexible substrate further has at least one non-bendable region;
    the first electrode layer further includes at least one first reference electrode insulated from the at least one first detection electrode; and
    the second electrode layer further includes at least one second reference electrode insulated from the at least one second detection electrode, wherein
    an orthogonal projection of a first reference electrode on the base overlaps at least partially with an orthogonal projection of a second reference electrode on the base; and
    orthogonal projections of the first reference electrode and the second reference electrode on the base are located in a non-bendable region.

3. The flexible substrate according to claim 2, wherein the first detection electrode and the second detection electrode are both strip-shaped electrodes;
    extending directions of the first detection electrode and the second detection electrode the orthogonal projections of which on the base overlap are substantially the same; and
    the first reference electrode and the second reference electrode are both strip-shaped electrodes; and extending directions of the first reference electrode and the second reference electrode the orthogonal projections of which on the base overlap are substantially the same.

4. The flexible substrate according to claim 3, wherein the bendable region is strip-shaped;
    an extending direction of the bendable region intersects with the extending direction of the first detection electrode; and
    the extending direction of the bendable region is substantially the same as the extending directions of the first reference electrode and the second reference electrode the orthogonal projections of which on the base overlap.

5. The flexible substrate according to claim 4, wherein an included angle between the extending direction of the bendable region and the extending direction of the first detection electrode is in a range from 70° to 130°.

6. The flexible substrate according to claim 4, wherein the flexible substrate comprises a plurality of first detection electrodes and a plurality of corresponding second detection electrodes, and one bendable region overlaps with regions where orthogonal projections of at least two first detection electrodes and at least two corresponding second detection electrodes on the base are located;
 extending directions of the at least two first detection electrodes and the at least two corresponding second detection electrodes are substantially the same, the at least two first detection electrodes are disposed at intervals, and the at least two corresponding second detection electrodes are disposed at intervals;
 in the at least two first detection electrodes and the at least two corresponding second detection electrodes, lengths of a first detection electrode and a corresponding second detection electrode relatively away from a center of the flexible substrate in their extending direction are greater than lengths of a first detection electrode and a corresponding second detection electrode relatively proximate to the center of the flexible substrate in their extending direction;
 the flexible substrate comprises a plurality of first reference electrodes and a plurality of corresponding second reference electrodes,
 extending directions of the plurality of first reference electrodes and the plurality of corresponding second reference electrodes are substantially the same, the plurality of first reference electrodes are disposed at intervals, and the plurality of corresponding second reference electrodes are disposed at intervals; and
 in the plurality of first reference electrodes and the plurality of corresponding second reference electrodes, lengths of a first reference electrode and a corresponding second reference electrode relatively away from the center of the flexible substrate in their extending direction are greater than lengths of a first reference electrode and a corresponding second reference electrode relatively proximate to the center of the flexible substrate in their extending direction.

7. The flexible substrate according to claim 4, wherein the flexible substrate has a plurality of bendable regions disposed at intervals, and extending directions of the plurality of bendable regions are substantially the same;
 the flexible substrate comprises a plurality of first detection electrodes and a plurality of corresponding second detection electrodes, and each bendable region overlaps with a region where orthogonal projections of at least one first detection electrode and at least one corresponding second detection electrode on the base are located; and
 the flexible substrate comprises a plurality of first reference electrodes and a plurality of corresponding second reference electrodes,
 a number of the plurality of first reference electrodes is the same as a number of the plurality of first detection electrodes; and
 the plurality of first reference electrodes are located at two opposite sides of the plurality of bendable regions as a whole in a direction perpendicular to an extending direction of the bendable regions.

8. The flexible substrate according to claim 2, wherein the first detection electrode and the second detection electrode each have a plurality of through holes; and
 the first reference electrode and the second reference electrode each have a plurality of through holes.

9. The flexible substrate according to claim 1, wherein an orthogonal projection of the first electrode layer on the base is located within an orthogonal projection of the first insulating layer on the base, and the first electrode layer is covered by the first insulating layer.

10. The flexible substrate according to claim 1, further comprising:
 a barrier layer disposed on a side of the second electrode layer away from the base; and
 a buffer layer disposed on a side of the barrier layer away from the second electrode layer.

11. A display panel, comprising:
 the flexible substrate according to claim 1; and
 a common signal interface and a detection signal interface disposed on the flexible substrate, wherein
 one of the first detection electrode and the second detection electrode in the flexible substrate is coupled to the detection signal interface, and another one is coupled to the common signal interface.

12. The display panel according to claim 11, wherein the flexible substrate includes at least one first reference electrode and at least one second reference electrode,
 one of the first reference electrode and the second reference electrode is coupled to the detection signal interface, and another one is coupled to the common signal interface; and electrodes in a same electrode layer are coupled to a same interface.

13. The display panel according to claim 11, further comprising:
 at least one detection wire disposed on the flexible substrate, a detection wire in the at least one detection wire connecting the detection signal interface to the first detection electrode or the second detection electrode, wherein
 the flexible substrate includes at least one first reference electrode and at least one second reference electrode, and the display panel further comprises:
 at least one reference wire disposed on the flexible substrate, a reference wire in the at least one reference wire connecting the detection signal interface to the first reference electrode or the second reference electrode.

14. The display panel according to claim 13, further comprising:
 at least one thin film transistor disposed on the flexible substrate, the thin film transistor including an active layer, a gate, a source, a drain, a portion of a gate insulating layer disposed between the active layer and the gate, and a portion of an interlayer dielectric layer disposed between the gate and both the source and the drain, wherein
 the detection wire is disposed in a same layer and made of a same material as the source and the drain of the thin film transistor;
 the detection wire is coupled to the first detection electrode or the second detection electrode through a first via hole, the first via hole penetrating film layers between a film layer where the source and the drain are located and the first electrode layer or the second electrode layer;

the reference wire is disposed in a same layer and made of a same material as the source and the drain of the thin film transistor; and the reference wire is coupled to the first reference electrode or the second reference electrode through a second via hole, the second via hole penetrating the film layers between the film layer where the source and the drain are located and the first electrode layer or the second electrode layer.

15. The display panel according to claim 13, further comprising:
at least one signal amplification circuit disposed on the flexible substrate or bonded to the flexible substrate, wherein
the detection wire is coupled to the detection signal interface through the signal amplification circuit; and
the reference wire is coupled to the detection signal interface through the signal amplification circuit or another signal amplification circuit.

16. The display panel according to claim 15, wherein the display panel comprises one signal amplification circuit, a plurality of detection wires and a plurality of reference wires;
each detection wire is coupled to the signal amplification circuit; and the signal amplification circuit is configured to sequentially perform amplification processing on signals from the detection wires in a time-sharing manner; and
the signal amplification circuit is further coupled to each reference wire; and the signal amplification circuit is further configured to sequentially perform amplification processing on signals from the reference wires in a time-sharing manner.

17. The display panel according to claim 15, wherein the display panel comprises a plurality of signal amplification circuits;
each detection wire is connected to one signal amplification circuit;
each reference wire is connected to another signal amplification circuit; and
a signal amplification circuit in the plurality of signal amplification circuits is configured to perform amplification processing on a signal from a detection wire or a reference wire to which the signal amplification circuit is coupled.

18. A display apparatus, comprising:
the display panel according to claim 12; and
a signal processor coupled to the detection signal interface in the display panel,
the signal processor being configured to receive a detection signal transmitted by the detection signal interface, obtain an amount of change of capacitance between at least one first detection electrode and at least one corresponding second detection electrode in the display panel according to the detection signal, and obtain a bending angle of the display panel according to the amount of change of the capacitance.

19. The display apparatus according to claim 18, further comprising:
a command recognition component configured to recognize a user command; and
a bending drive mechanism coupled to the command recognition component, the bending drive mechanism being configured to drive the display panel to bend according to the user command, and control the display panel to stop bending in a case where the bending angle of the display panel reaches a preset angle.

* * * * *

UNITED STATES PATENT AND TRADEMARK OFFICE
CERTIFICATE OF CORRECTION

PATENT NO. : 11,974,493 B2  
APPLICATION NO. : 17/281420  
DATED : April 30, 2024  
INVENTOR(S) : Hongwei Tian et al.

Page 1 of 1

It is certified that error appears in the above-identified patent and that said Letters Patent is hereby corrected as shown below:

In the Claims

Column 32, Claim 18, Line 14:
"the display panel according to claim 12" should be "the display panel according to claim 11".

Signed and Sealed this
Ninth Day of July, 2024

Katherine Kelly Vidal
*Director of the United States Patent and Trademark Office*